US012001639B2

(12) United States Patent
Oh et al.

(10) Patent No.: US 12,001,639 B2
(45) Date of Patent: Jun. 4, 2024

(54) TOUCH DISPLAY DEVICE AND DISPLAY PANEL

(71) Applicant: LG Display Co., Ltd., Seoul (KR)

(72) Inventors: Wooram Oh, Paju-si (KR); JeHyung Park, Paju-si (KR); KyungSu Ha, Paju-si (KR); Dayeong Lee, Paju-si (KR); SeungHo Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/893,035

(22) Filed: Aug. 22, 2022

(65) Prior Publication Data

US 2023/0059891 A1     Feb. 23, 2023

(30) Foreign Application Priority Data

Aug. 23, 2021   (KR) .................. 10-2021-0111090

(51) Int. Cl.
*G06F 3/044*     (2006.01)
*G06F 3/041*     (2006.01)
(Continued)

(52) U.S. Cl.
CPC ........ *G06F 3/0446* (2019.05); *G06F 3/04164* (2019.05); *G02F 1/13338* (2013.01);
(Continued)

(58) Field of Classification Search
CPC .. G06F 3/04164; G06F 3/0446; G06F 3/0443; G06F 2203/04112;
(Continued)

(56) References Cited

U.S. PATENT DOCUMENTS

2010/0013800 A1   1/2010 Elias et al.
2014/0293168 A1  10/2014 Tsai et al.
(Continued)

FOREIGN PATENT DOCUMENTS

EP       2645211 A2   10/2013
EP       3401769 A1   11/2018
(Continued)

*Primary Examiner* — Deeprose Subedi
(74) *Attorney, Agent, or Firm* — Seed IP Law Group LLP

(57) ABSTRACT

Embodiments of the present disclosure relate to a touch display device and a display panel. The touch display device comprises a display panel in which a plurality of X-touch electrodes arranged in a first direction are electrically connected to form a X-touch electrode line and a plurality of X-touch electrode lines arranged in parallel to receive a plurality of touch driving signals, and a plurality of Y-touch electrode lines are extended to a second direction to transmit a plurality of touch sensing signals; and a touch driving circuit for supplying the plurality of touch driving signals to the plurality of X-touch electrode lines and for sensing a touch by detecting the plurality of touch sensing signals from the plurality of Y-touch electrode lines, wherein a plurality of X-touch lines transmitting the plurality of touch driving signals to the plurality of X-touch electrode lines are extended in the second direction and are alternately connected to the plurality of X-touch electrodes through a plurality of touch contact holes to electrically connect a plurality of X-touch electrodes constituting a same X-touch electrode line.

28 Claims, 17 Drawing Sheets

(51) Int. Cl.
   *G02F 1/1333* (2006.01)
   *H10K 59/122* (2023.01)
   *H10K 59/40* (2023.01)

(52) U.S. Cl.
   CPC .. *G06F 3/0412* (2013.01); *G06F 2203/04111* (2013.01); *G06F 2203/04112* (2013.01); *H10K 59/122* (2023.02); *H10K 59/40* (2023.02)

(58) Field of Classification Search
   CPC ......... G06F 2203/04111; G06F 3/0412; G02F 1/13338; H10K 59/40; H10K 59/122
   See application file for complete search history.

(56) References Cited

U.S. PATENT DOCUMENTS

| 2015/0077370 | A1 | | 3/2015 | Kim et al. |
| 2015/0185936 | A1 | * | 7/2015 | Kim ................. G06F 3/0412 345/174 |
| 2018/0145114 | A1 | | 5/2018 | Sim et al. |
| 2019/0074328 | A1 | | 3/2019 | Park |

FOREIGN PATENT DOCUMENTS

| EP | 3657310 A1 | 5/2020 |
| EP | 3671415 A1 | 6/2020 |
| EP | 3846010 A1 | 7/2021 |

* cited by examiner

TOUCH DISPLAY DEVICE AND DISPLAY PANEL

CROSS REFERENCE TO RELATED APPLICATION

This application claims priority from Korean Patent Application No. 10-2021-0111090, filed on Aug. 23, 2021, which is hereby incorporated by reference for all purposes as if fully set forth herein.

BACKGROUND

Technical Field

Embodiments of the present disclosure relate to a touch display device and a display panel capable of improving touch sensing performance by reducing a number of touch lines and securing an area of touch electrodes.

Description of the Related Art

With the development of the information society, there has been an increasing demand for a variety of types of image display devices. In this regard, a range of display devices, such as liquid crystal display device, electroluminescence display device, or quantum dot light emitting display device have recently come into widespread use.

In order to provide more diverse functions, such a display device provides a function of detecting a user's finger touch or a pen touch on a display panel and performing a signal processing based on the detected touch data.

As an example, a touch display device capable of detecting a touch includes a plurality of touch electrodes disposed or embedded in the display panel, and may detect a presence or not of a user's touch and touch coordinates on the display panel by driving these touch electrodes.

Such a touch display device may be a mobile device such as a smart phone and a tablet PC, as well as a large-screen touch display device such as a display for automobiles and exhibitions.

In the touch display device, if a number of touch lines connected to touch electrodes is increased to improve a touch sensing performance, the touch sensing performance may be degraded since an area of the touch electrodes is relatively reduced.

In addition, as a length of the touch lines increases, parasitic capacitance due to coupling between the touch lines and the touch electrodes increases, which may cause a problem in which touch sensitivity and touch sensing accuracy may be degraded.

BRIEF SUMMARY

Accordingly, the inventors of the present disclosure invented a touch display device and a display panel capable of improving touch sensing performance by reducing a number of touch lines and securing an area of touch electrodes.

The problems to be solved according to the embodiments of the present disclosure described below are not limited to the problems mentioned above, and other problems that are not mentioned will be clearly understood by those skilled in the art from the following description.

A touch display device according to an embodiment of present disclosure includes a display panel in which a plurality of X-touch electrodes arranged in a first direction are electrically connected to form a X-touch electrode line and a plurality of X-touch electrode lines arranged in parallel to receive a plurality of touch driving signals, and a plurality of Y-touch electrode lines are extended to a second direction to transmit a plurality of touch sensing signals; and a touch driving circuit for supplying the plurality of touch driving signals to the plurality of X-touch electrode lines and for sensing a touch by detecting the plurality of touch sensing signals from the plurality of Y-touch electrode lines, wherein a plurality of X-touch lines transmitting the plurality of touch driving signals to the plurality of X-touch electrode lines are extended in the second direction and are alternately connected to the plurality of X-touch electrodes through a plurality of touch contact holes to electrically connect a plurality of X-touch electrodes constituting a same X-touch electrode line.

In the touch display device according to an embodiment of present disclosure, the plurality of X-touch lines are alternately connected by N (N is a natural number greater than or equal to 2) as a unit.

In the touch display device according to an embodiment of present disclosure, the plurality of touch contact holes are disposed to be displaced from each other in both areas based on the plurality of Y-touch electrode lines.

In the touch display device according to an embodiment of present disclosure, the plurality of touch contact holes through which the plurality of X-touch lines are electrically connected to designated X-touch electrode are arranged so that distances to adjacent Y-touch electrode line are uniform.

In the touch display device according to an embodiment of present disclosure, the plurality of X-touch electrode lines are shifted at uniform interval in a shifting area.

In the touch display device according to an embodiment of present disclosure, the distance at which the plurality of X-touch electrode lines are shifted corresponds to an interval between adjacent X-touch lines.

In the touch display device according to an embodiment of present disclosure, a direction in which the plurality of X-touch lines are shifted in the shifting area is a diagonal direction of adjacent Y-touch electrode line.

In the touch display device according to an embodiment of present disclosure, the shifting area is formed in an area where mesh-type touch electrode metals constituting the X-touch electrode are not formed.

In the touch display device according to an embodiment of present disclosure, the plurality of X-touch lines are arranged such that a predetermined or selected pattern is repeated based on a touch node where the plurality of X-touch electrode lines and the plurality of Y-touch electrode lines overlap.

In the touch display device according to an embodiment of present disclosure, the plurality of touch contact holes through which the plurality of X-touch lines are electrically connected to designated X-touch electrode are electrically connected to X-touch electrode connection lines located on both sides of the Y-touch electrode line.

In the touch display device according to an embodiment of present disclosure, a first area in which the plurality of X-touch electrode lines are formed has a ratio of 5:1 to 2:1 with a second area in which the plurality of Y-touch electrode lines are formed.

A display panel according to an embodiment of present disclosure includes a plurality of X-touch electrode lines arranged in parallel to receive a plurality of touch driving signals in which a plurality of X-touch electrodes arranged in a first direction are electrically connected to form a X-touch electrode line; a plurality of Y-touch electrode lines extended in a second direction to transmit a plurality of touch sensing signals; and a plurality of X-touch lines extended in the second direction and alternately connected to the plurality of X-touch electrodes through a plurality of touch contact holes to electrically connect a plurality of X-touch electrodes constituting a same X-touch electrode line.

According to embodiments of the present disclosure, it is possible to provide a touch display device and a display panel capable of improving touch sensing performance by reducing a number of touch lines and securing an area of touch electrodes.

The effects of the embodiments disclosed in the present disclosure are not limited to the above mentioned effects. In addition, the embodiments disclosed in the present disclosure may cause another effect not mentioned above, which will be clearly understood by those skilled in the art from the following description.

DETAILED DESCRIPTION

Figure 1:
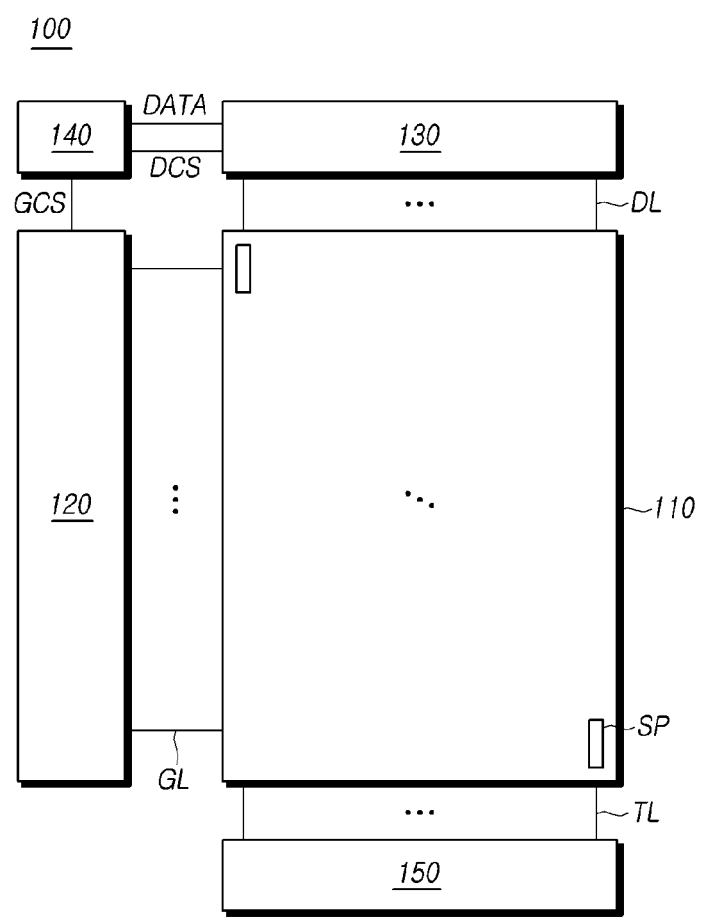
FIG. 1 illustrates a schematic diagram of a touch display device according to embodiments of the present disclosure.

The advantages and features of the present disclosure and methods of the realization thereof will be apparent with reference to the accompanying drawings and detailed descriptions of the embodiments. The present disclosure should not be construed as being limited to the embodiments set forth herein and may be embodied in a variety of different forms. Rather, these embodiments are provided so that the present disclosure will be thorough and complete, and will fully convey the scope of the present disclosure to those having ordinary knowledge in the technical field.

The shapes, sizes, ratios, angles, numbers, and the like, inscribed in the drawings to illustrate embodiments are illustrative only, and the present disclosure is not limited to the embodiments illustrated in the drawings. Throughout this document, the same reference numerals and symbols will be used to designate the same or like components. In the following description of the present disclosure, detailed descriptions of known functions and components incorporated into the present disclosure will be omitted in the situation in which the subject matter of the present disclosure may be rendered unclear thereby. It will be understood that the terms "comprise," "include," "have," and any variations thereof used herein are intended to cover non-exclusive inclusions unless explicitly described to the contrary. Descriptions of components in the singular form used herein are intended to include descriptions of components in the plural form, unless explicitly described to the contrary.

In the analysis of a component, it shall be understood that an error range is included therein, even in the situation in which there is no explicit description thereof.

When spatially relative terms, such as "on," "above," "under," "below," and "on a side of," are used herein for descriptions of relationships between one element or component and another element or component, one or more intervening elements or components may be present between the one and other elements or components, unless a term, such as "directly," is used.

When temporally relative terms, such as "after," "subsequent," "following," and "before" are used to define a temporal relationship, a non-continuous case may be included unless the term "immediately" or "directly" is used.

In descriptions of signal transmission, such as "a signal is sent from node A to node B," a signal may be sent from node A to node B via another node unless the term "immediately" or "directly" is used.

In addition, terms, such as "first" and "second" may be used herein to describe a variety of components. It should be understood, however, that these components are not limited by these terms. These terms are merely used to discriminate one element or component from other elements or components. Thus, a first component referred to as first hereinafter may be a second component within the spirit of the present disclosure.

The features of embodiments of the present disclosure may be partially or entirely coupled or combined with each other and may work in concert with each other or may operate in a variety of technical methods. In addition, respective embodiments may be carried out independently or may be associated with and carried out in concert with other embodiments.

Hereinafter, a variety of embodiments will be described in detail with reference to the accompanying drawings.

FIG. 1 illustrates a schematic diagram of a touch display device according to embodiments of the present disclosure.

Referring to FIG. 1 the touch display device 100 according to embodiments of the present disclosure may include a display panel 110, a gate driving circuit 120, a data driving circuit 130, a timing controller 140 and a touch driving circuit 150 to detect a touch on the display panel 110.

A plurality of gate lines GL and a plurality of data lines DL are disposed in the display panel 110, and a plurality of subpixels SP are disposed in areas in which the gate lines GL overlap the data lines DL.

In addition, a plurality of touch electrodes may be disposed on or within the display panel 110, and a plurality of touch lines TL electrically connecting the touch electrodes and the touch driving circuit 150 may be disposed in the display panel 110.

Describing a display driving operation in the touch display device 100, the gate driving circuit 120 controls the driving timing of the subpixels SP disposed in the display panel 110. In addition, the data driving circuit 130 supplies a data voltage corresponding to image data to the subpixels SP. Accordingly, the subpixels SP are displaying an image by illuminating luminous intensities corresponding to grayscale levels of the image data.

Specifically, the gate driving circuit 120 is controlled by the timing controller 140, and controls the driving timing of the plurality of subpixels SP by sequentially supplying scan signals to the plurality of gate lines GL disposed in the display panel 110.

The gate driving circuit 120 may include one or more gate driving integrated circuits (GDIC), which may be disposed on one or both sides of the display panel 110, depending on the driving scheme. Alternatively, the gate driving circuit 120 may be implemented with a gate-in-panel (GIP) structure directly embedded in a bezel area of the display panel 110.

The data driving circuit 130 receives digital image data from the timing controller 140, and converts the received digital image data into an analog data voltage. In addition, the data driving circuit 130 supplies the data voltage to the respective data lines DL at time which the scan signals are supplied through the gate lines GL, so that the respective subpixels SP display luminous intensities according to the data voltage.

The data driving circuit 130 may include one or more source driving integrated circuits (SDICs).

The timing controller 140 supplies a variety of control signals to the gate driving circuit 120 and the data driving circuit 130, and controls the operations of the gate driving circuit 120 and the data driving circuit 130.

The timing controller 140 controls the gate driving circuit 120 to supply the scan signals at time according to timing realized by respective frames, converts source image data received from an external source into an image data DATA with a format readable by the data driving circuit 130, and supplies the converted image data DATA to the data driving circuit 130.

The timing controller 140 also receives a variety of timing signals, including a vertical synchronization signal, a horizontal synchronization signal, an input data enable signal, a clock signal, and the like, as well as the image data DATA from the external source (e.g., a host system).

The timing controller 140 may generate a data control signal DCS and a gate control signal GCS using the variety of timing signals received from the external source, and supply the control signals DCS, GCS to the data driving circuit 130 and the gate driving circuit 120.

For example, the timing controller 140 generates a variety of gate control signals GCS, including a gate start pulse signal, a gate shift clock signal, a gate output enable signal, and the like, to control the gate driving circuit 120.

Here, the gate start pulse signal is used to control the operation start timing of one or more gate driving integrated circuits in the gate driving circuit 120. The gate shift clock signal is a clock signal commonly supplied to the one or more gate driving integrated circuits to control the shift timing of the scan signals. The gate output enable signal designates timing information of the one or more gate driving integrated circuits.

In addition, the timing controller 140 generates a variety of data control signals DCS, including a source start pulse signal, a source sampling clock signal, a source output enable signal, and the like, to control the data driving circuit 130.

Here, the source start pulse signal is used to control the data sampling start timing of one or more source driving integrated circuits in the data driving circuit 130. The source sampling clock signal is a clock signal for controlling the sampling timing of data voltage in each of the source driving integrated circuits. The source output enable signal controls the output timing of the data driving circuit 130.

The touch display device 100 may further include a power management integrated circuit for supplying various types of voltage or current to the display panel 110, the gate driving circuit 120, the data driving circuit 130, and the like, or controls various types of voltage or current to be supplied to the same.

Meanwhile, when an encapsulation layer is formed on the upper portion of the display panel 110 and a touch electrode is disposed on the upper portion of the display panel 110, capacitance for driving the touch electrode may be increased. For this reason, it is beneficial to increase the level of the touch driving signal for driving the touch electrode. For the purpose of above, a level shifter (not shown) may be added between the touch driving circuit 150 and the display panel 110 to control the level of the touch driving signal.

The subpixels SP are positioned adjacent to regions of overlap of the gate lines GL and the data lines DL. Liquid crystals or light emitting elements may be disposed in the subpixels SP, depending on the type of the touch display device 100.

For example, in a case in which the touch display device 100 is a liquid crystal display device, the touch display device 100 includes a light source device, such as a backlight unit or structure, to illuminate the display panel 110, and liquid crystals are disposed in the subpixels SP of the display panel 110. In addition, the touch display device 100 may display luminous intensities and an image data by adjusting the alignment of the liquid crystals using electromagnetic fields generated in response to the data voltage supplied to the subpixels SP.

In the case of a liquid crystal display device, the display panel 110 includes a liquid crystal layer formed between two substrates, and it may be operated in any known mode such as Twisted Nematic (TN) mode, Vertical Alignment (VA) mode, In Plane Switching (IPS) mode, or Fringe Field Switching (FFS) mode. On the other hand, in the case of an electroluminescent display device, the display panel 110 may be implemented in a top emission type, a bottom emission type, or a dual emission type.

In addition, the touch display device 100 according to embodiments of the present disclosure may detect a user's touch on the display panel 110 using the touch electrodes TE included in the display panel 110, and the touch driving circuit 150.

Figure 2:
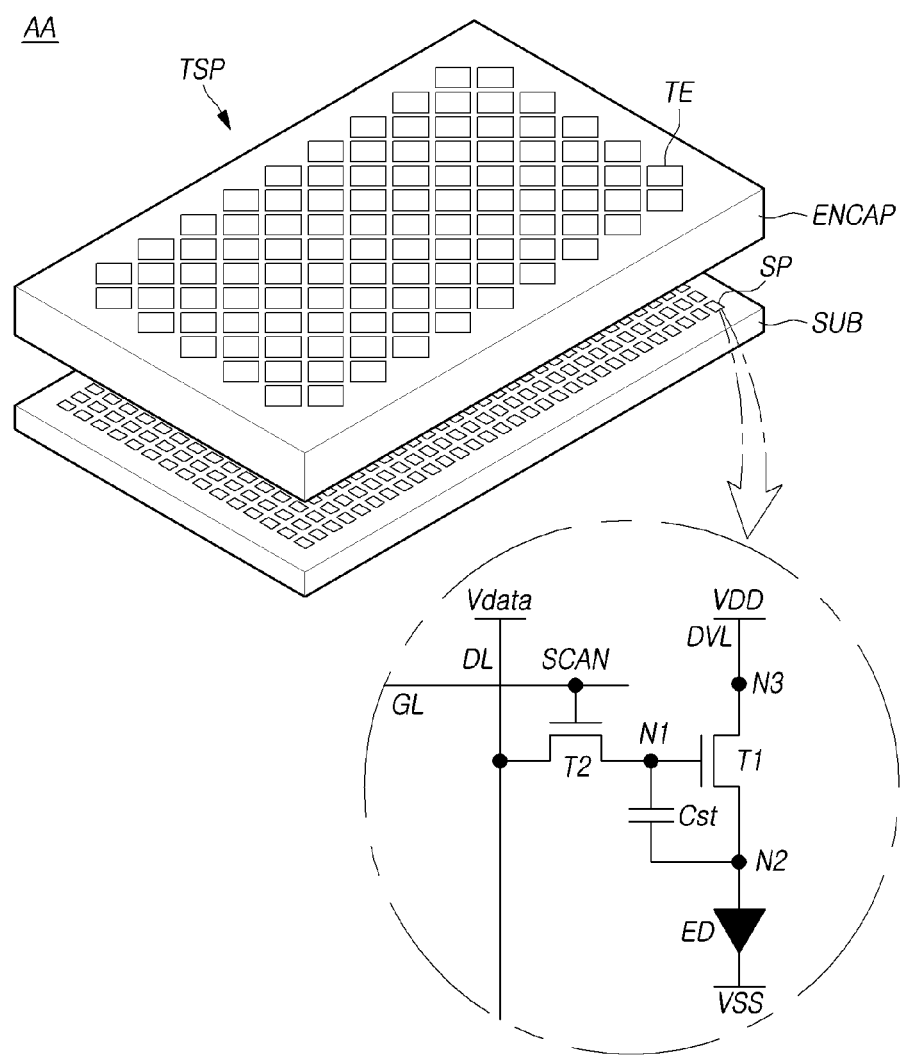
FIG. 2 illustrates a structure in which a touch screen panel is embedded in a display panel of a touch display device according to an embodiment of the present disclosure.

FIG. 2 illustrates a structure in which a touch screen panel is embedded in a display panel of a touch display device according to embodiments of the present disclosure.

Referring to FIG. 2, a plurality of subpixels SP may be disposed on a substrate SUB in an active area AA of the display panel 110 in the touch display device 100 according to embodiments of the present disclosure.

Each subpixel SP may include a light emitting element ED, a first transistor T1 for driving the light emitting element ED, a second transistor T2 for transmitting a data voltage Vdata to a first node N1 of the first transistor T1, and a storage capacitor Cst for maintaining a constant voltage for one frame.

The first transistor T1 may include a first node N1 to which a data voltage Vdata may be supplied through the second transistor T2, a second node N2 electrically connected to the light emitting element ED, and a third node N3 to which a driving voltage VDD is supplied from a driving voltage line DVL. The first node N1 may be a gate node, the second node N2 may be a source node or a drain node, and the third node N3 may be a drain node or a source node. The first transistor T1 may also be referred to as a driving transistor for driving the light emitting element ED.

The light emitting element ED may include a first electrode (e.g., an anode electrode), a light emitting layer, and a second electrode (e.g., a cathode electrode). The first electrode may be electrically connected to the second node N2 of the first transistor T1, and the second electrode may be supplied with a base voltage VSS.

The light emitting layer of the light emitting element ED may be an organic light emitting layer containing an organic material. In this case, the light emitting element ED may be an organic light emitting diode.

The second transistor T2 may be controlled to be turned on and off by a scan signal SCAN supplied through a gate line GL, and may be electrically connected between the first node N1 of the first transistor T1 and the data line DL. The second transistor T2 may also be referred to as a switching transistor.

When the second transistor T2 is turned on by the scan signal SCAN, a data voltage Vdata supplied through the data line DL is transmitted to the first node N1 of the first transistor T1.

The storage capacitor Cst may be electrically connected between the first node N1 and the second node N2 of the first transistor T1.

Each subpixel SP may have a 2T1C structure including two transistors T1, T2 and one capacitor Cst, and may further include one or more transistors, or may further include one or more capacitors in some cases.

The storage capacitor Cst may be an external capacitor which is intentionally designed to be provided outside the first transistor T1, instead of a parasitic capacitor which is provided between the first node N1 and the second node N2 of the first transistor T1.

Each of the first transistor T1 and the second transistor T2 may be an n-type transistor or a p-type transistor.

On the other hand, circuit elements such as a light emitting element ED, two or more transistors T1, T2, and one or more capacitors Cst, may be disposed in the display panel 110. Since the circuit elements are vulnerable to external moisture or oxygen, an encapsulation layer ENCAP for preventing external moisture or oxygen from penetrating into the circuit elements may be disposed in the display panel 110.

The touch screen panel TSP may be embedded in the display panel 110 by being disposed on the encapsulation layer ENCAP in the touch display device 100 according to embodiments of the present disclosure. For example, a plurality of touch electrodes TE constituting the touch screen panel TSP may construct the display panel 110 by being disposed on the encapsulation layer ENCAP in the touch display device 100.

The touch display device 100 may sense a touch by a mutual-capacitance scheme or a self-capacitance scheme, as a capacitance based touch sensing scheme.

In case of a touch sensing scheme based on mutual-capacitance, a plurality of touch electrodes TE may be classified as touch driving electrodes which is supplied with touch driving signals through touch driving lines, and touch sensing electrodes which supplies touch sensing signals through touch sensing lines and forms capacitances with the touch driving electrodes. Here, the touch driving lines and the touch sensing lines may be referred to as touch lines. Also, the touch driving signals and the touch sensing signals may be referred to as touch signals.

In case of the touch sensing scheme based on mutual-capacitance, the touch presence or not and the touch coordinate may be detected based on a change of mutual-capacitance formed between the touch driving electrode and the touch sensing electrode according to a presence or not of a pointer such as a finger, a pen, or the like.

In case of the touch sensing scheme based on self-capacitance, each touch electrode serves as both the touch driving electrode and the touch sensing electrode. That is, a touch driving signal is supplied to a touch electrode TE through a touch line, and a touch sensing signal generated in the touch electrode, to which the touch driving signal is supplied, is transmitted through the same touch line. Accordingly, in case of the touch sensing scheme based on self-capacitance, there is no distinction between the touch driving electrode and the touch sensing electrode and no distinction between the touch driving line and the touch sensing line.

In case of the touch sensing scheme based on self-capacitance, the touch presence or and a touch coordinate may be detected based on a change in capacitance formed between a pointer such as a finger, a pen, or the like, and a touch electrode TE.

Thus, the touch display device 100 may sense a touch by the touch sensing scheme based on mutual-capacitance or the touch sensing scheme based on self-capacitance.

Figure 3:
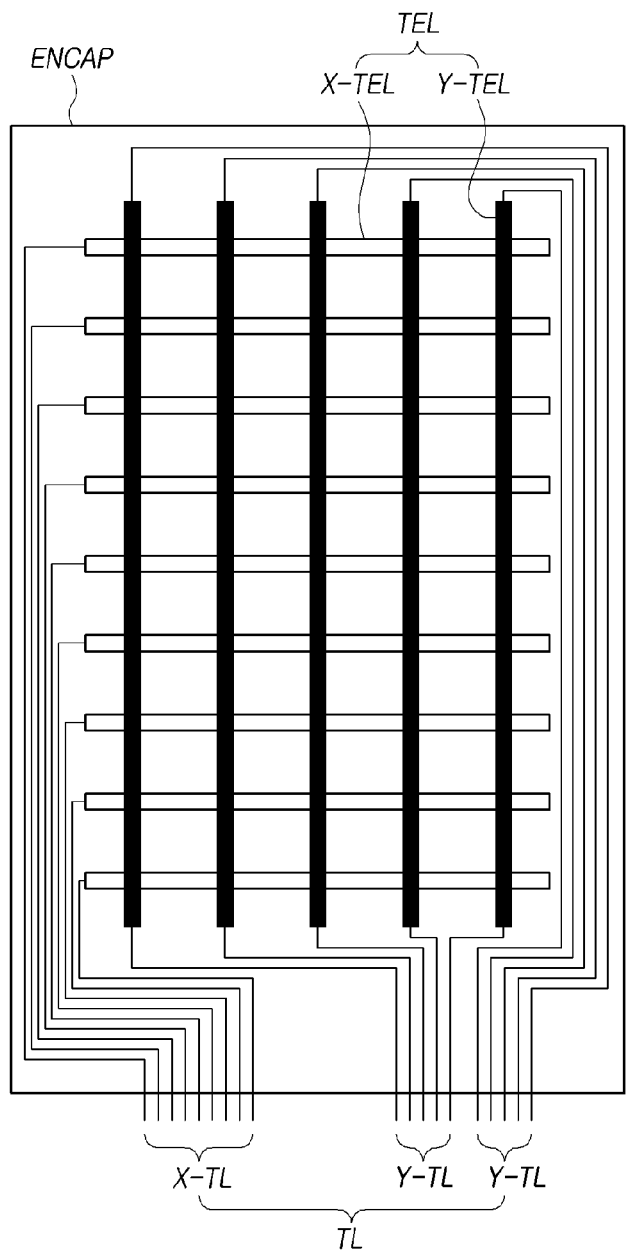
FIG. 3 illustrates a structure of touch electrodes for touch sensing operation based on mutual-capacitance in a touch display device according to embodiments of the present disclosure.

FIG. 3 illustrates a structure of touch electrodes for touch sensing operation based on mutual-capacitance in a touch display device according to embodiments of the present disclosure.

Referring to FIG. 3, the structure of touch electrodes for touch sensing operation based on mutual-capacitance in the touch display device 100 according to embodiments of the present disclosure may include a plurality of X-touch electrode lines X-TEL and a plurality of Y-touch electrode lines Y-TEL (collectively called as touch electrode lines TEL). Here, the plurality of X-touch electrode lines X-TEL and the plurality of Y-touch electrode lines Y-TEL may be located on the encapsulation layer ENCAP.

A plurality of X-touch electrode lines X-TEL may be disposed in a first direction, and a plurality of Y-touch electrode lines Y-TEL may be disposed in a second direction different from the first direction.

In the present specification, the first direction and the second direction may be relatively different directions. For example, the first direction may be an x-axis direction and the second direction may be a y-axis direction. Conversely, the first direction may be the y-axis direction and the second direction may be the x-axis direction. Further, the first direction and the second direction may be orthogonal to each other, but may not be orthogonal to each other. Also, rows and columns in the present specification are relative, and the rows and columns may be changed according to a viewing point of view.

Each of the plurality of X-touch electrode line X-TEL may be composed of a plurality of electrically connected X-touch electrodes, and each of the plurality of Y-touch electrode line Y-TEL may be composed of a plurality of electrically connected Y-touch electrodes.

Here, the plurality of X-touch electrodes and the plurality of Y-touch electrodes correspond to a plurality of touch electrodes TE having different roles (functions) respectively.

For example, the plurality of X-touch electrodes constituting the X-touch electrode line X-TEL may be touch driving electrodes, and the plurality of Y-touch electrodes constituting the Y-touch electrode line Y-TEL may be touch sensing electrodes. In this case, the plurality of X-touch electrode lines X-TEL will correspond to a plurality of touch driving electrode lines, and the plurality of Y-touch electrode lines Y-TEL will correspond to a plurality of touch sensing electrode lines.

Conversely, the plurality of X-touch electrodes constituting the plurality of X-touch electrode lines X-TEL may be touch sensing electrodes, and the plurality of Y-touch electrodes constituting the plurality of Y-touch electrode lines Y-TEL may be touch driving electrodes. In this case, the plurality of X-touch electrode lines X-TEL will correspond to a plurality of touch sensing electrode lines, and the plurality of Y-touch electrode lines Y-TEL will correspond to a plurality of touch driving electrode lines.

A touch sensor metal for touch sensing may include a plurality of touch lines TL in addition to the plurality of X-touch electrode lines X-TEL and the plurality of Y-touch electrode lines Y-TEL.

The plurality of touch lines TL may include at least one X-touch line X-TL connected to the plurality of X-touch electrode lines X-TEL, and at least on Y-touch line Y-TL connected to the plurality of Y-touch electrode lines Y-TEL.

Figure 4:
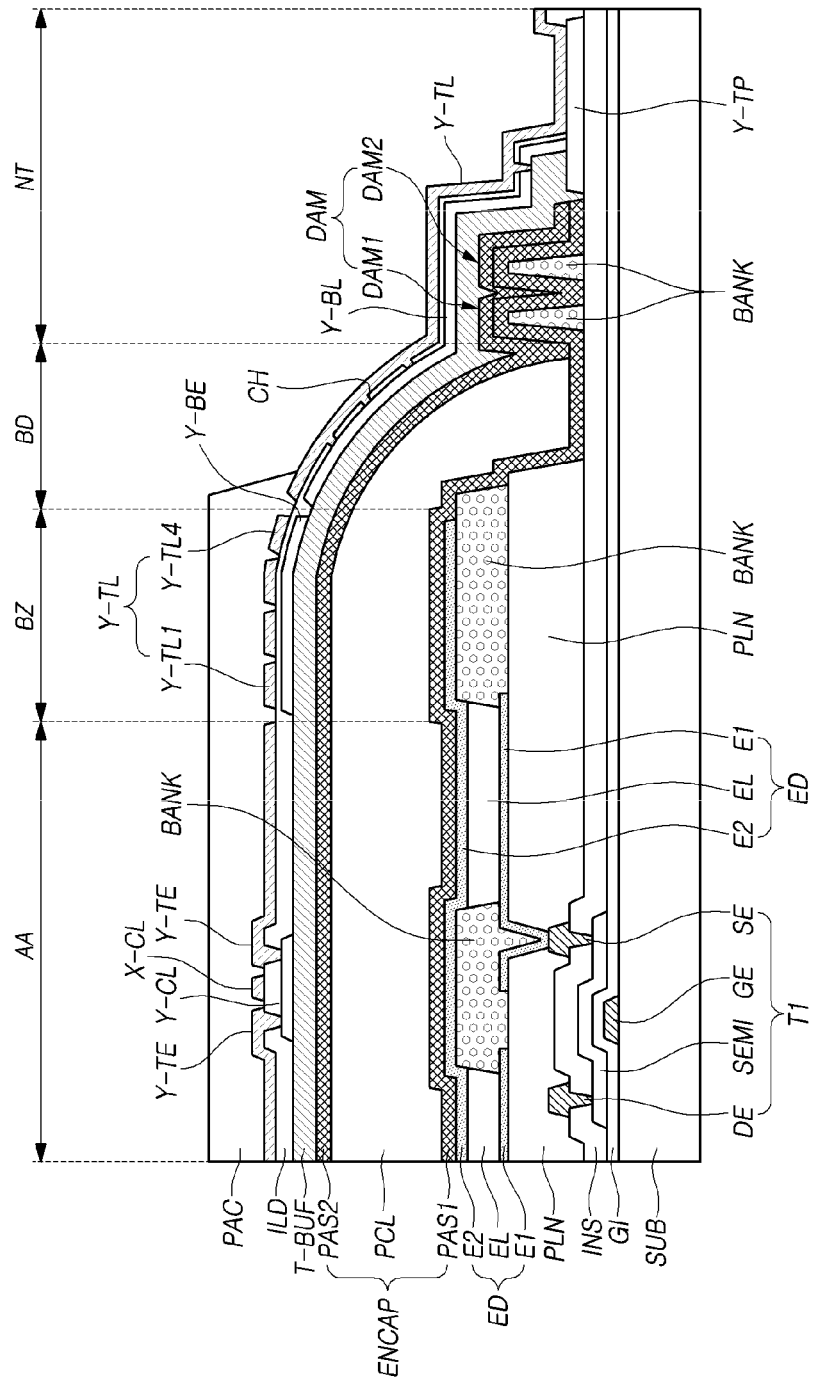
FIG. 4 illustrates a diagram of a cross-section in the touch display device according to an embodiment of the present disclosure.

FIG. 4 illustrates a diagram of a cross-section in the touch display device according to an embodiment of the present disclosure.

Here, the Y-touch electrode Y-TE is shown in a plate shape, which is only an example, and may be of a mesh type.

Referring to FIG. 4, in the display device 100 according to an embodiment of the present disclosure, a first transistor T1 which is a driving transistor DRT in the subpixel SP located in the active area AA may be arranged on a substrate SUB.

The first transistor T1 may include a gate electrode GE, a source electrode SE, a drain electrode DE, and a semiconductor layer SEMI. In this case, the source electrode SE and the drain electrode DE may be made of the same material as the first node electrode NE1 and the second node electrode NE2 located in a bending area BD.

The gate electrode GE and the semiconductor layer SEMI may overlap each other with a gate insulating film GI interposed therebetween. The source electrode SE may be arranged on an insulating layer INS so as to contact one side of the semiconductor layer SEMI, and the drain electrode DE may be arranged on the insulating layer INS so as to contact the other side of the semiconductor layer SEMI.

The light emitting element ED may include a first electrode E1 corresponding to an anode electrode (or a cathode electrode), a light emitting layer EL arranged on the first electrode E1, and a second electrode E2 corresponding to a cathode electrode (or an anode electrode) arranged on the light emitting layer EL.

The first electrode E1 is electrically connected to the source electrode SE of the driving transistor DRT, which is exposed through a pixel contact hole that penetrates a planarization film PLN.

The light emitting layer EL is arranged on a first electrode E1 of a light emitting area defined by a bank BANK. The light emitting layer EL may be formed by laminating a hole-related layer, the light emitting layer, and an electron-related layer on the first electrode E1 in this order or in the reverse order. The second electrode E2 may be arranged to face the first electrode E1 with the light emitting layer EL interposed therebetween.

The encapsulation layer ENCAP prevents external moisture or oxygen from infiltrating the light emitting element ED, which is vulnerable to external moisture or oxygen. The encapsulation layer ENCAP may include a single layer or may include a plurality of layers PAS1, PCL, PAS2.

For example, when the encapsulation layer ENCAP includes a plurality of layers PAS1, PCL, PAS2, the encapsulation layer ENCAP may include at least one inorganic encapsulation layer PAS1, PAS2 and at least one organic encapsulation layer PCL. As a specific example, the encapsulation layer ENCAP may be structured to include a first inorganic encapsulation layer PAS1, an organic encapsulation layer PCL, and a second inorganic encapsulation layer PAS2 laminated successively.

The organic encapsulation layer PCL may further include at least one organic encapsulation layer or at least one inorganic encapsulation layer.

The first inorganic encapsulation layer PAS1 is arranged on the substrate SUB, on which a second electrode E2 corresponding to a cathode electrode is formed, to be most adjacent to the light emitting element ED. The first inorganic encapsulation layer PAS1 is, for example, made of an inorganic insulation material that can be deposited at a low temperature, such as silicon nitride ($SiN_x$), silicon oxide ($SiO_x$), silicon oxynitride (SiON), or aluminum oxide ($Al_2O_3$). Since the first inorganic encapsulation layer PAS1 is deposited at a low temperature, the first inorganic encapsulation layer PAS1 may prevent damage to the light emitting layer EL including an organic material that is vulnerable to a high temperature during a deposition process.

The organic encapsulation layer PCL may be formed to have an area smaller than the first inorganic encapsulation layer PAS1. In this case, the organic encapsulation layer PCL may be formed to expose both ends of the first inorganic encapsulation layer PAS1. The organic encapsulation layer PCL may have a role of buffering stress between respective layers as a result of bending of the touch display device 100 as an organic light emitting display device, and may have a role of enhancing the planarization performance. For example, the organic encapsulation layer PCL may be made of an organic insulation material, such as acrylic resin, epoxy resin, polyimide, polyethylene, or silicon oxycarbide (SiOC).

When the organic encapsulation layer PCL is formed in an inkjet method, one dam or at least two dams DAM may be arranged in a boundary area between a non-active area (bezel area BZ, bending area BD, and notch area NT) and the active area AA, or in a dam area corresponding to a partial area in the non-active area.

For example, the dam area may be located between the active area AA and a pad area in which a plurality of touch pads TP are arranged in the non-active area and, a primary dam DAM1 that is adjacent to the active area AA and a secondary dam DAM2 that is adjacent to the pad area may exist in the dam area.

When a liquid type organic encapsulation layer PCL is formed in the active area AA, the at least one dam DAM arranged in the dam area may prevent the liquid type organic encapsulation layer PCL from collapsing toward the non-active area and infiltrating the pad area.

The primary dam DAM1 or the secondary damp DAM2 may be formed in a structure of a single layer or multi-layer. For example, the primary dam DAM1 or the secondary damp DAM2 may be simultaneously formed with the same material as that of at least one among the bank BANK and the spacer (not illustrated). In this case, a dam structure may be formed without a process of adding a mask and without increasing the cost.

The primary dam DAM1 or the secondary damp DAM2 may have a structure that the first inorganic encapsulation layer PAS1 and the second inorganic encapsulation layer PAS2 are laminated on the bank BANK. The organic encapsulation layer PCL including an organic material may be arranged on the inner portion of the primary dam DAM1, or arranged on the upper portion of at least a part of the primary dam DAM1 and the secondary dam DAM2.

The second inorganic encapsulation layer PAS2 may be formed to cover the upper surface and side surface of each of the organic encapsulation layer PCL and the first inorganic encapsulation layer PAS1 on the substrate SUB on which the organic encapsulation layer PCL is formed. The second inorganic encapsulation layer PAS2 minimizes, reduces or blocks infiltration of external moisture or oxygen into the first inorganic encapsulation layer PAS1 and the organic encapsulation layer PCL. For example, the second inorganic encapsulation layer PAS2 is made of an inorganic insulation material such as silicon nitride ($SiN_x$), silicon oxide ($SiO_x$), silicon oxynitride (SiON), or aluminum oxide ($Al_2O_3$).

A touch buffer layer T-BUF may be arranged on the encapsulation layer ENCAP. The touch buffer layer T-BUF may be arranged between a touch sensor metal including touch electrodes X-TE, Y-TE and touch electrode connection lines X-CL, Y-CL, and the second electrode E2 of the light emitting element ED.

The touch buffer layer T-BUF may be designed such that a spacing distance between the touch sensor metal and the second electrode E2 of the light emitting element ED maintains a predetermined or selected minimum or reduced spacing distance (for example, 1 μm). This may reduce or prevent the parasitic capacitance formed between the touch sensor metal and the second electrode E2 of the light emitting element ED, thereby preventing degradation of touch sensitivity caused by the parasitic capacitance.

On the other hand, it also possible to arrange a touch sensor metal including touch electrodes X-TE, Y-TE and touch electrode connection lines X-CL, Y-CL on the encapsulation layer ENCAP, without the touch buffer layer T-BUF.

The touch buffer layer T-BUF may also block infiltration of a liquid chemical (development liquid, etching liquid, or the like) used during a process of manufacturing the touch sensor metal arranged on the touch buffer layer T-BUF or external moisture into the light emitting layer EL including an organic material. As such, the touch buffer layer T-BUF may diminish damage to the light emitting layer EL which is vulnerable to liquid chemicals or moisture.

The touch buffer layer T-BUF is made of an organic insulation material which can be formed at a low temperature equal to or lower than a predetermined or selected temperature (for example, 100° C.) and has a low permittivity, in order to prevent damage to the light emitting layer EL including an organic material which is vulnerable to a high temperature. For example, the touch buffer layer T-BUF may be made of an acrylate-based material, an epoxy-based material, or a siloxane-based material. The touch buffer layer T-BUF, which is made of an organic insulation material and thus has a planarization performance, may diminish damage to inner layers PAS1, PCL, PAS2 constituting the encapsulation layer ENCAP and fracture of the touch sensor metal formed on the touch buffer layer T-BUF as a result of bending of the organic light emitting display device.

In a case of the touch sensor structure based on mutual-capacitance, the X-touch electrode line X-TEL and the Y-touch electrode line Y-TEL may be arranged on the touch buffer layer T-BUF, and the X-touch electrode line X-TEL and the Y-touch electrode line Y-TEL may be arranged so as to overlap. The Y-touch electrode line Y-TEL may include a plurality of Y-touch electrode connection lines Y-CL that electrically connect between the plurality of Y-touch electrodes Y-TE.

The plurality of Y-touch electrodes Y-TE and the plurality of Y-touch electrode connection lines Y-CL may be arranged on different layers with the interlayer dielectric ILD interposed therebetween.

Each of the plurality of Y-touch electrodes Y-TE may be spaced apart with each other by a predetermined or selected distance along the y-axis direction. The plurality of Y-touch electrodes Y-TE may be electrically connected to a different Y-touch electrode Y-TE that is adjacent in the y-axis direction through a Y-touch electrode connection line Y-CL.

The Y-touch electrode connection line Y-CL may be arranged on the touch buffer layer T-BUF and exposed through a touch contact hole that penetrates the interlayer dielectric ILD to be electrically connected to two Y-touch electrodes Y-TE that are adjacent in the y-axis direction.

The Y-touch electrode connection line Y-CL may be arranged so as to overlap with the bank BANK. This may diminish degradation of the aperture ratio due to the Y-touch electrode connection line Y-CL.

The X-touch electrode line X-TEL may include a plurality of X-touch electrode connection lines X-CL that electrically connect between the plurality of X-touch electrodes X-TE. The plurality of X-touch electrodes X-TE and the plurality of X-touch electrode connection lines X-CL may be arranged on different layers with the interlayer dielectric ILD interposed therebetween.

Each of the plurality of X-touch electrodes X-TE may be spaced apart by a predetermined or selected distance along the x-axis direction on the interlayer dielectric ILD. The plurality of X-touch electrodes X-TE may be electrically connected to a different X-touch electrode X-TE that is adjacent in the x-axis direction through an X-touch electrode connection line X-CL.

The X-touch electrode connection line X-CL may be arranged on the same plane with the X-touch electrodes X-TE and electrically connected to two X-touch electrodes X-TE that are adjacent in the x-axis direction without a separate contact hole, or may be integrated with two X-touch electrodes X-TE that are adjacent in the x-axis direction.

The X-touch electrode connection line X-CL may be arranged so as to overlap with the bank BANK. This may diminish degradation of the aperture ratio due to the X-touch electrode connection line X-CL.

The Y-touch electrode lines Y-TEL may be electrically connected to the touch driving circuit 150 through a Y-touch line Y-TL and a Y-touch pad Y-TP. Likewise, the X-touch electrode lines X-TEL may be electrically connected to the touch driving circuit 150 through an X-touch line X-TL and an X-touch pad X-TP.

A pad cover electrode may be additionally arranged to cover the X-touch pad X-TP and the Y-touch pad Y-TP.

The X-touch pad X-TP may be formed separately from the X-touch line X-TL or may be formed by extension of the X-touch line X-TL. The Y-touch pad Y-TP may be formed separately from the Y-touch line Y-TL or may be formed by extension of the Y-touch line Y-TL.

When the X-touch pad X-TP is formed by extension from the X-touch line X-TL and the Y-touch pad Y-TP is formed by extension from the Y-touch line Y-TL, the X-touch pad X-TP, the X-touch line X-TL, the Y-touch pad Y-TP, and the Y-touch line Y-TL may be made of the same first conductive material. Here, the first conductive material may be formed of a single layer or multi-layer structure using, for example, a metal which has high corrosion resistance, high acid resistance, and excellent conductivity, such as Al, Ti, Cu, and Mo.

For example, the X-touch pad X-TP, the X-touch line X-TL, the Y-touch pad Y-TP, and the Y-touch line Y-TL, which are made of the first conductive material, may be formed in a three-layer structure including laminated Ti/Al/Ti or Mo/Al/Mo.

The pad cover electrode capable of covering the X-touch pad X-TP and the Y-touch pad Y-TP may be made of a second conductive material that is identical to the material of the X-touch electrode X-TE and Y-touch electrodes Y-TE. The second conductive material may be a transparent conductive material having high corrosion resistance and high acid resistance, such as ITO or IZO. The pad cover electrode may be formed to be exposed by the touch buffer layer T-BUF such that it is bonded to the touch driving circuit 150 or bonded to a circuit film on which the touch driving circuit 150 is mounted.

The touch buffer layer T-BUF may be formed to cover the touch sensor metal to prevent the touch sensor metal from being corroded by external moisture or the like. For example, the touch buffer layer T-BUF may be made of an organic insulation material, a circular polarizing plate, an epoxy-based or acrylate-based film. The touch buffer layer T-BUF may not exist on the encapsulation layer ENCAP. That is, the touch buffer layer T-BUF may not be an essential element (e.g., may be an optional element).

The Y-touch line Y-TL may be electrically connected to the Y-touch electrode Y-TE through a touch line contact hole or may be integrated with the Y-touch electrode Y-TE.

The Y-touch line Y-TL may extend to the non-active area and be electrically connected to the Y-touch pad Y-TP through the upper and side surface of the encapsulation layer ENCAP and the upper and side surface of the dam DAM. Accordingly, the Y-touch line Y-TL may be electrically connected to the touch driving circuit 150 through the Y-touch pad Y-TP.

The Y-touch line Y-TL may transmit a touch sensing signal from the Y-touch electrode Y-TE to the touch driving circuit 150, or may transmit a touch driving signal from the touch driving circuit 150 to the Y-touch electrode Y-TE.

At this time, a Y-touch bridge line Y-BL may be arranged to connect to a contact hole CH under the Y-touch line Y-TL in the notch area NT and the bending area BD. Since the Y-touch line Y-TL and the Y-touch bridge line Y-BL are electrically connected to at least one contact hole CH formed at uniform distances, the same touch driving signal or touch sensing signal may be transmitted.

As such, when the Y-touch line Y-TL and the Y-touch bridge line Y-BL are electrically connected, the electrical resistance may be reduced in the process of transmitting the touch driving signal or the touch sensing signal. In addition, when the Y-touch line Y-TL and the Y-touch bridge line Y-BL are connected through the plurality of contact holes CH, touch sensing performance may be maintained since the touch signal (touch driving signal or touch sensing signal) may be bypassed through the contact hole CH even if the Y-touch line Y-TL or Y-touch bridge line is disconnected in some area.

The Y-touch line Y-TL and the Y-touch bridge line may be insulated in some area other than the contact hole CH by the interlayer dielectric ILD disposed therebetween.

On the other hand, a plurality of Y-touch lines Y-TL1, Y-TL2, Y-TL3, Y-TL4 may be arranged in the bezel area BA, and a Y-touch bridge electrode Y-BE with an integral structure may be arranged under them.

The Y-touch bridge electrode Y-BE has an integrated structure, and the width of the Y-touch bridge electrode Y-BE may be equal to or wider than the Y-touch lines Y-TL1, Y-TL2, Y-TL3, Y-TL4 to cover the area arranged by the Y-touch lines Y-TL1, Y-TL2, Y-TL3, Y-TL4 on the upper area.

At this time, the Y-touch bridge electrode Y-BE is connected to the ground voltage GND so as to discharge the noise charge flowing into the display panel 110, and is separated from the touch bridge line Y-BL or the second node electrode NE2 arranged in the bending area BD.

Accordingly, a noise charge flowing into the display panel 110 may be easily discharged to the ground voltage GND through the Y-touch bridge electrode Y-BE formed as an integral structure to cover the area of the Y-touch lines Y-TL1, Y-TL2, Y-TL3, Y-TL4. As a result, it is possible to improve the touch sensing performance of the display device 100 and reduce defects caused by display driving operation.

The X-touch line X-TL may be electrically connected to the X-touch electrode X-TE through a touch line contact hole or integrated with the X-touch electrode X-TE.

The X-touch line X-TL may be extended to the non-active area and be electrically connected to the X-touch pad X-TP through the upper and side surface of the encapsulation layer ENCAP, and the upper and side surface of the dam DAM. Accordingly, the X-touch line X-TL may be electrically connected to the touch driving circuit 150 through the X-touch pad X-TP.

The X-touch line X-TL may transmit a touch driving signal from the touch driving circuit 150 to the X-touch electrode X-TE, and may transmit a touch sensing signal from the X-touch electrode X-TE to the touch driving circuit 150.

The arrangement of the X-touch line X-TL and the Y-touch line Y-TL may be modified according to panel design configuration or specification.

A touch protective film PAC may be arranged on the X-touch electrode X-TE and the Y-touch electrode Y-TE. The touch protective film PAC may extend to the front or rear side of the dam DAM so as to be arranged on the X-touch line X-TL and the Y-touch line Y-TL as well.

On the other hand, the cross-sectional view shown here conceptually shows the structure of the touch display device 100, the position, thickness, or width of each pattern (various layers or various electrodes) according to the viewing direction or position, etc., may be changed and the connection structure of various patterns may be changed. Moreover, additional layers may exist in addition to the illustrated several layers, and some of the illustrated several layers may be omitted or integrated. For example, the width of the bank BANK may be narrower than the drawing, and the height of the dam DAM may be lower or higher than the drawing.

The touch display device 100 may be used in mobile devices such as smartphones and tablet PCs, and may be used in large-screen display devices such as automobile displays and exhibition displays.

However, when the number of touch lines TL connected to the touch electrode TE is increased in order to improve the touch sensing performance of the touch display device 100, it may be a problem that the touch sensing performance is degraded since the area of the touch electrode TE is relatively reduced.

Also, as the length of the touch line TL increases, parasitic capacitance due to coupling between the touch line TL and the touch electrode TE increases, so that the touch sensitivity and the touch sensing accuracy may be degraded.

The touch display device 100 according to an embodiment of the present disclosure may improve the touch sensing performance by reducing the number of touch lines TL and securing the area of the touch electrodes TE based on a multi-feeding structure in which the touch lines TL are alternately arranged.

Figure 5:
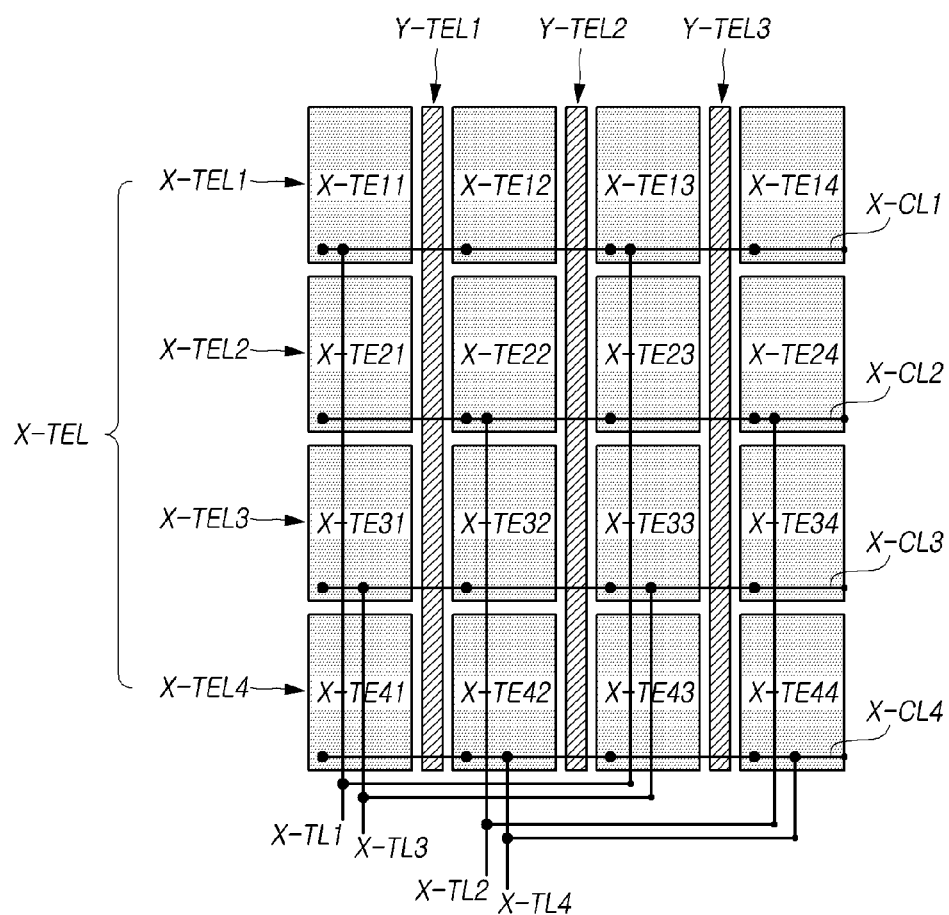
FIG. 5 illustrates a diagram of a multi-feeding structure in which touch lines are alternately arranged in a touch display device according to an embodiment of the present disclosure.

FIG. 5 illustrates a diagram of a multi-feeding structure in which touch lines are alternately arranged in a touch display device according to an embodiment of the present disclosure.

Referring to FIG. 5, the touch display device 100 according to an embodiment of the present disclosure may reduce the number of touch lines TL and secure the area of the touch electrode TE by alternately arranging X-touch lines X-TL or Y-touch lines Y-TL.

Here, a touch sensing structure based on mutual-capacitance arranged the touch electrodes TE11-TE44 in a 4×4 matrix is described as an example.

In the case of the touch sensing structure based on mutual-capacitance, the X-touch electrode line X-TEL and the Y-touch electrode line Y-TEL may be arranged to cross each other.

For example, the first X-touch electrode line X-TEL1 may be formed of an X-touch electrode X-TE11 at row 1, column 1, an X-touch electrode X-TE12 at row 1, column 2, an X-touch electrode X-TE13 at row 1, column 3, and an X-touch electrode X-TE14 at row 1, column 4.

At this time, the X-touch electrodes X-TE11, X-TE12, X-TE13, X-TE14 located at row 1 may be connected in X-axis direction by the first X-touch electrode connection line X-CL1. Accordingly, the touch signal transmitted through some of the X-touch electrodes X-TE11, X-TE12, X-TE13, X-TE14 located at the row 1 may be supplied to all of the X-touch electrodes X-TE11, X-TE12, X-TE13, X-TE14 located at row 1 by the first X-touch electrode connection line X-CL1.

In addition, the X-touch electrodes X-TE21, X-TE22, X-TE23, X-TE24 located at row 2 may be connected in X-axis direction by the second X-touch electrode connection line X-CL2. Accordingly, the touch signal transmitted through some of the X-touch electrodes X-TE21, X-TE22, X-TE23, X-TE24 located at the row 2 may be supplied to all of the X-touch electrodes X-TE21, X-TE22, X-TE23, X-TE24 located at row 2 by the second X-touch electrode connection line X-CL2.

In this state, the X-touch lines X-TL1, X-TL2, X-TL3, X-TL4 extending in the y-axis direction are alternately arranged to be connected to the X-touch electrodes X-TE11 to X-TE44.

For example, the X-touch electrode X-TE11 located at row 1, column 1 among the X-touch electrodes X-TE11, X-TE21, X-TE31, X-TE41 in column 1 may be connected to the first X-touch line X-TL1, and the X-touch electrode X-TE31 located at row 3, column 1 may be connected to the third X-touch line X-TL3.

On the other hand, the X-touch electrode X-TE21 located at row 2, column 1 and the X-touch electrode X-TE41 located at row 4, column 1 are not connected to the X-touch line X-TL.

However, since the X-touch electrodes X-TE11, X-TE12, X-TE13, X-TE14 located at row 1 are connected in the x-axis direction by the X-touch electrode connection line X-CL1 located at row 1, the touch signal transmitted through the first X-touch line X-TL1 may be supplied to all of the X-touch electrodes X-TE11, X-TE12, X-TE13, X-TE14 located at row 1.

Likewise, since the X-touch electrodes X-TE31, X-TE32, X-TE33, X-TE34 located at row 3 are connected in the x-axis direction by the X-touch electrode connection line X-CL3 located at row 3, the touch signal transmitted through the third X-touch line X-TL3 may be supplied to all of the X-touch electrodes X-TE31, X-TE32, X-TE33, X-TE34 located at row 3.

Accordingly, since just two X-touch lines X-TL1, X-TL3 may be arranged in the area where the four X-touch electrodes X-TE11, X-TE21, X-TE31, X-TE41 located at column 1 are arranged to transmit a touch signal, the number of touch lines TL may be reduced.

At this time, the X-touch electrode X-TE22 located at row 2, column 2 among the X-touch electrodes X-TE12, X-TE22, X-TE32, X-TE42 in column 2 may be connected to the second X-touch line X-TL2, and the X-touch electrode X-TE42 located at row 4, column 2 may be connected to the fourth X-touch line X-TL4. On the other hand, the X-touch electrode X-TE12 located at row 1, column 2 and the X-touch electrode X-TE32 located at row 3, column 2 are not connected to the X-touch line X-TL.

Thereby, a connection point of the X-touch lines X-TL1, X-TL3 connected to the X-touch electrode located at column 1 corresponding to the left area based on the first Y-touch electrode line Y-TEL1 may be arranged from the other connection point of the X-touch lines X-TL2, X-TL4 connected to the X-touch electrodes located at column 2 corresponding to the right area.

As a result, since just two X-touch lines X-TL2, X-TL4 may be arranged in the area where the four X-touch electrodes X-TE12, X-TE22, X-TE32, X-TE42 located at column 2 to transmit a touch signal, the number of touch lines TL can be reduced.

Meanwhile, for the X-touch electrodes X-TE13, X-TE23, X-TE33, X-TE43 located at column 3, the X-touch line X-TL may be connected in the same structure as in column 1. That is, the X-touch electrode X-TE13 located at row 1, column 3 may be connected to the first X-touch line X-TL1, and the X-touch electrode X-TE33 located at row 3, column 3 may be connected to the third X-touch line X-TL3. On the other hand, the X-touch electrode X-TE23 located at row 2, column 3 and the X-touch electrode X-TE43 located at row 4, column 3 are not connected to the X-touch line X-TL.

Likewise, for the X-touch electrodes X-TE14, X-TE24, X-TE34, X-TE44 located at column 4, the X-touch line X-TL may be connected in the same structure as in column 2. That is, the X-touch electrode X-TE24 located at row 2, column 4 may be connected to the second X-touch line X-TL2, and the X-touch electrode X-TE44 located at row 4, column 4 may be connected to the fourth X-touch line X-TL4. On the other hand, the X-touch electrode X-TE14 located at row 1, column 4 and the X-touch electrode X-TE34 located at row 3, column 4 are not connected to the X-touch line X-TL.

As described above, through the multi-feeding structure in which the touch lines TL are alternately arranged and the touch signals are simultaneously supplied to the X-touch electrodes X-TE located at the same row, the touch sensing performance may be improved by reducing the number of touch lines TL and securing the area of the touch electrode TE.

Meanwhile, the touch display device 100 according to an embodiment of the present disclosure may have all of the X-touch electrodes X-TE formed in the same shape, but some of the X-touch electrodes X-TE may be of different shapes.

Figure 6:
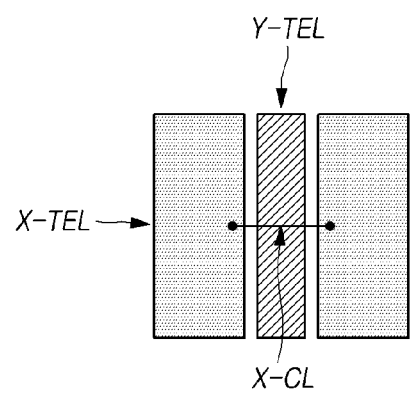
FIGS. 6 and 7 illustrate various structures of a touch electrode line in a touch display device according to an embodiment of the present disclosure.
Figure 7:
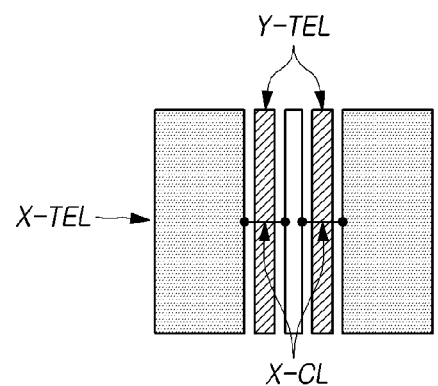

FIGS. 6 and 7 illustrate various structures of a touch electrode line in a touch display device according to an embodiment of the present disclosure.

Referring to FIGS. 6 and 7, the touch display device 100 according to an embodiment of the present disclosure may be formed of touch electrode lines X-TEL, Y-TEL with various structures.

For example, as shown in FIG. 6, the touch display device 100 according to an embodiment of the present disclosure may include an X-touch electrode line X-TEL formed by X-touch electrodes X-TE with same shapes on both sides of the x-axis direction based on the Y-touch electrode line Y-TEL with a single bar structure extending in the y-axis direction.

Alternatively, as shown in FIG. 7, a Y-touch electrode line Y-TEL consisting of two bars may be arranged in a split structure based on an X-touch electrode line X-TEL with a thin structure, and a X-touch electrode line X-TEL may be formed by X-touch electrodes X-TE with same shapes based on the Y-touch electrode line Y-TEL with two bar structure.

At this time, the X-touch electrode lines X-TEL separated by the Y-touch electrode line Y-TEL may be connected through the X-touch electrode connection line X-CL, respectively.

Meanwhile, the area of the X-touch electrode line X-TEL receiving the touch driving signal and the area of the Y-touch electrode line Y-TEL transmitting the touch sensing signal may be the same or different.

For example, when it is desired to relatively reduce the parasitic capacitance of the Y-touch electrode line Y-TEL transmitting the touch sensing signal, the area of the Y-touch electrode line Y-TEL may be formed smaller than the area of the X-touch electrode line X-TEL. In this case, the area of the X-touch electrode line X-TEL receiving the touch driving signal and the area of the Y-touch electrode line Y-TEL transmitting the touch sensing signal have a ratio of 5:1 to 2:1. As an example, the area of the X-touch electrode line X-TEL and the area of the Y-touch electrode line Y-TEL may be formed in a ratio of 4:1.

The structure of these touch electrode lines X-TEL, Y-TEL may be variously amended according to the size or use of the touch display device 100.

Figure 8:
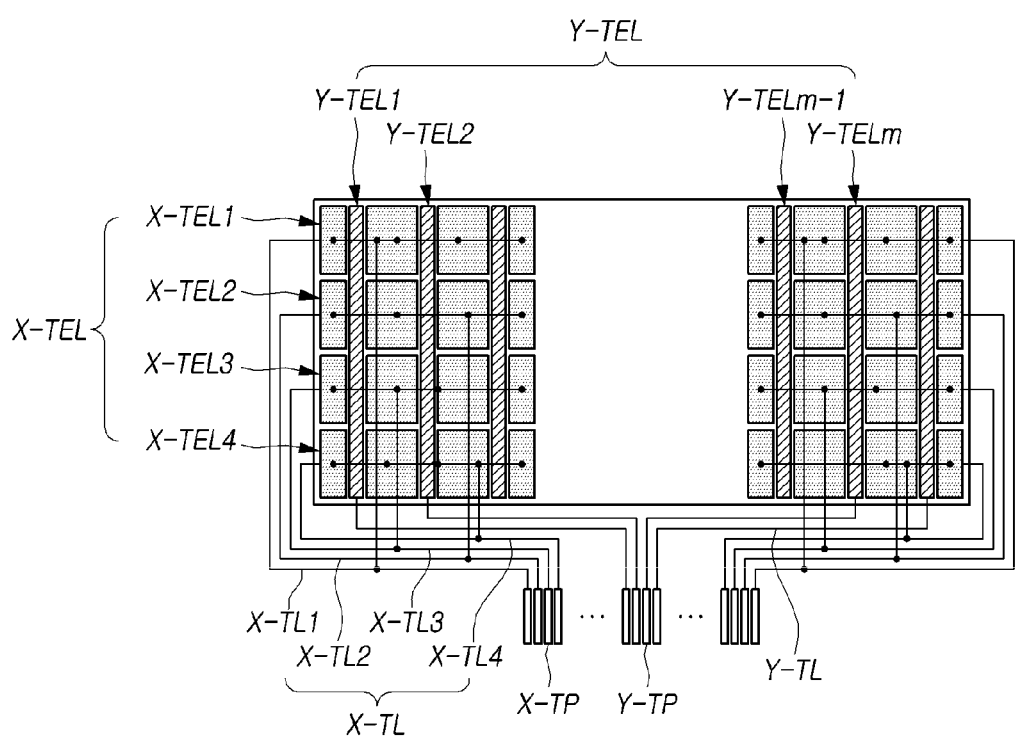
FIG. 8 illustrates a display panel with a multi-feeding structure in which touch lines are alternately arranged in a touch display device according to an embodiment of the present disclosure.

FIG. 8 illustrates a display panel with a multi-feeding structure in which touch lines are alternately arranged in a touch display device according to an embodiment of the present disclosure.

Referring to FIG. 8, the touch display device 100 according to an embodiment of the present disclosure may have a multi-feeding structure in which X-touch lines X-TL are alternately arranged in order to reduce the number of touch lines.

At this time, when a plurality of X-touch electrodes arranged in the x-axis direction constitute one X-touch electrode line X-TEL, the plurality of X-touch electrodes constituting the X-touch electrode line X-TEL may be connected by the X-touch electrode connection line X-CL to supply a touch signal simultaneously to the plurality of X-touch electrodes, and the X-touch lines X-TL may be alternately connected to the plurality of X-touch electrodes arranged in the y-axis direction.

For example, the X-touch electrode X-TE11 located at row 1, column 1 among the X-touch electrodes X-TE11, X-TE21, X-TE31, X-TE41 arranged at column 1 may be connected to the first X-touch line X-TL1, and the X-touch electrode X-TE31 located at row 3, column 1 may be connected to the third X-touch line X-TL3.

On the other hand, the X-touch electrode X-TE22 located at row 2, column 2 among the X-touch electrodes X-TE12, X-TE22, X-TE32, X-TE42 arranged at column 2 may be connected to the second X-touch line X-TL2, and the X-touch electrode X-TE42 located at row 4, column 2 may be connected to the fourth X-touch line X-TL4.

As described above, the number of touch lines TL may be reduced and the area of the touch electrodes TE may be secured by alternately arranging the X-touch lines X-TL connected to the X-touch electrodes X-TE located at each column. In addition, the touch sensing performance may be improved through a multi-feeding structure in which the touch signal is simultaneously supplied to the X-touch electrodes X-TE located at the same row.

Meanwhile, the X-touch lines X-TL connected to the X-touch electrodes X-TE located at each column may be alternately arranged by plural as a unit or group.

Figure 9:
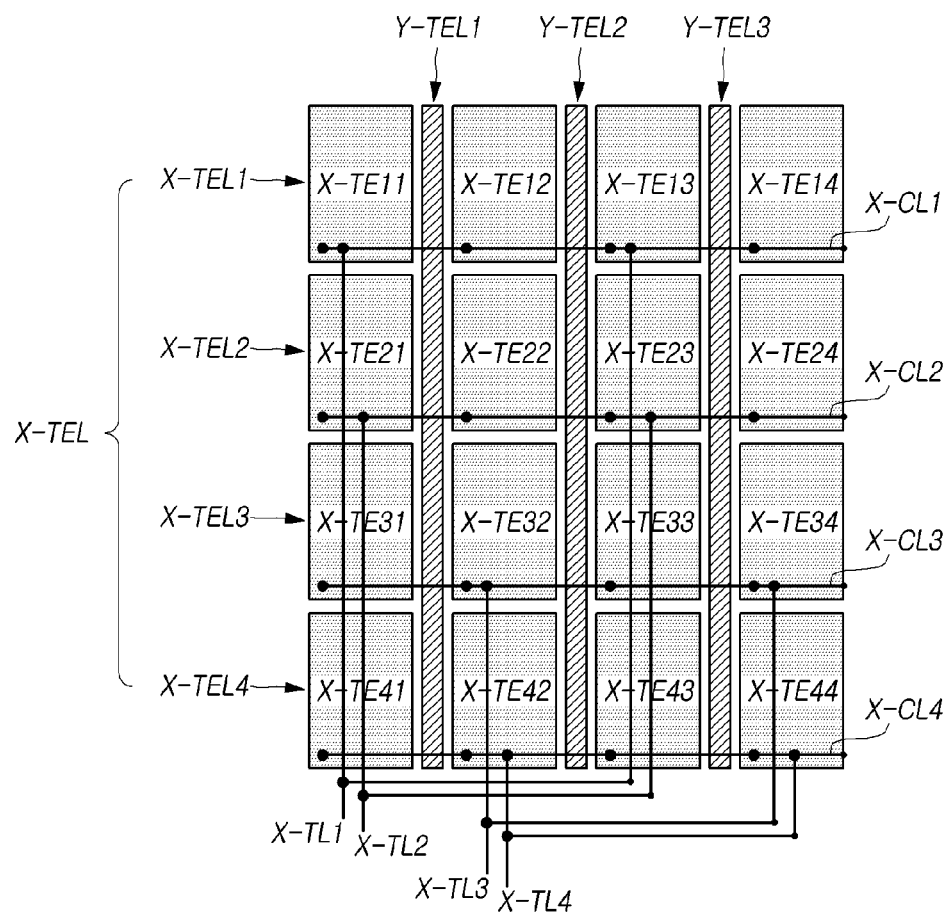
FIG. 9 illustrates a multi-feeding structure in which touch lines are alternately arranged by two as a unit in a touch display device according to an embodiment of the present disclosure.

FIG. 9 illustrates a multi-feeding structure in which touch lines are alternately arranged by two as a unit in a touch display device according to an embodiment of the present disclosure.

Referring to FIG. 9, the touch display device 100 according to an embodiment of the present disclosure may reduce the number of touch lines TL and secure the area of the touch electrode TE by alternately arranging the X-touch lines X-TL or the Y-touch lines Y-TL by plural as a unit.

Here, a touch sensing structure based on mutual-capacitance in which touch electrodes TE11-TE44 are arranged in a 4×4 matrix is described as an example.

In the case of the touch sensing structure based on mutual-capacitance, the X-touch electrode line X-TEL and the Y-touch electrode line Y-TEL may be arranged to cross each other.

For example, the first X-touch electrode line X-TEL1 may be formed of an X-touch electrode X-TE11 at row 1, column 1, an X-touch electrode X-TE12 at row 1, column 2, an X-touch electrode X-TE13 at row 1, column 3, and an X-touch electrode X-TE14 at row 1, column 4.

At this time, the X-touch electrodes X-TE11, X-TE12, X-TE13, X-TE14 located at row 1 may be connected in X-axis direction by the first X-touch electrode connection line X-CL1. Accordingly, the touch signal transmitted through some of the X-touch electrodes X-TE11, X-TE12, X-TE13, X-TE14 located at the row 1 may be supplied to all of the X-touch electrodes X-TE11, X-TE12, X-TE13, X-TE14 located at row 1 by the first X-touch electrode connection line X-CL1.

In addition, the X-touch electrodes X-TE21, X-TE22, X-TE23, X-TE24 located at row 2 may be connected in X-axis direction by the second X-touch electrode connection line X-CL2. Accordingly, the touch signal transmitted through some of the X-touch electrodes X-TE21, X-TE22, X-TE23, X-TE24 located at the row 2 may be supplied to all of the X-touch electrodes X-TE21, X-TE22, X-TE23, X-TE24 located at row 2 by the second X-touch electrode connection line X-CL2.

In this state, the X-touch lines X-TL1, X-TL2, X-TL3, X-TL4 extending in the y-axis direction may be connected to the X-touch electrodes X-TE11 to X-TE44 by alternately being arranged by two as a unit.

For example, the X-touch electrode X-TE11 located at row 1, column 1 among the X-touch electrodes X-TE11, X-TE21, X-TE31, X-TE41 in column 1 may be connected to the first X-touch line X-TL1, and the X-touch electrode X-TE21 located at row 2, column 1 may be connected to the second X-touch line X-TL2.

On the other hand, the X-touch electrode X-TE31 located at row 3, column 1 and the X-touch electrode X-TE41 located at row 4, column 1 are not connected to the X-touch line X-TL.

However, since the X-touch electrodes X-TE11, X-TE12, X-TE13, X-TE14 located at row 1 are connected in the x-axis direction by the X-touch electrode connection line X-CL1 located at row 1, the touch signal transmitted through the first X-touch line X-TL1 may be supplied to all of the X-touch electrodes X-TE11, X-TE12, X-TE13, X-TE14 located at row 1.

Likewise, since the X-touch electrodes X-TE21, X-TE22, X-TE23, X-TE24 located at row 2 are connected in the x-axis direction by the X-touch electrode connection line X-CL2 located at row 2, the touch signal transmitted through the second X-touch line X-TL2 may be supplied to all of the X-touch electrodes X-TE21, X-TE22, X-TE23, X-TE24 located at row 2.

Accordingly, since just two X-touch lines X-TL1, X-TL2 may be arranged in the area where the four X-touch electrodes X-TE11, X-TE21, X-TE31, X-TE41 located at column 1 are arranged to transmit a touch signal, the number of touch lines TL may be reduced.

At this time, the X-touch electrode X-TE32 located at row 3, column 2 among the X-touch electrodes X-TE12, X-TE22, X-TE32, X-TE42 in column 2 may be connected to the third X-touch line X-TL3, and the X-touch electrode X-TE42 located at row 4, column 2 may be connected to the fourth X-touch line X-TL4. On the other hand, the X-touch electrode X-TE12 located at row 1, column 2 and the X-touch electrode X-TE22 located at row 2, column 2 are not connected to the X-touch line X-TL.

Thereby, X-touch lines X-TL1, X-TL2 connected to the X-touch electrodes located at column 1 and X-touch lines X-TL3, X-TL4 connected to the X-touch electrodes located at column 2 may be alternately arranged by two as a unit. As a result, since just two X-touch lines X-TL3, X-TL4 may be arranged in the area where the four X-touch electrodes X-TE12, X-TE22, X-TE32, X-TE42 located at column 2 to transmit a touch signal, the number of touch lines TL can be reduced.

Meanwhile, for the X-touch electrodes X-TE13, X-TE23, X-TE33, X-TE43 located at column 3, the X-touch line X-TL may be connected in the same structure as in column 1. That is, the X-touch electrode X-TE13 located at row 1, column 3 may be connected to the first X-touch line X-TL1, and the X-touch electrode X-TE23 located at row 2, column 3 may be connected to the second X-touch line X-TL2. On the other hand, the X-touch electrode X-TE33 located at row 3, column 3 and the X-touch electrode X-TE43 located at row 4, column 3 are not connected to the X-touch line X-TL.

Likewise, for the X-touch electrodes X-TE14, X-TE24, X-TE34, X-TE44 located at column 4, the X-touch line X-TL may be connected in the same structure as in column 2. That is, the X-touch electrode X-TE34 located at row 3, column 4 may be connected to the third X-touch line X-TL3, and the X-touch electrode X-TE44 located at row 4, column 4 may be connected to the fourth X-touch line X-TL4. On the other hand, the X-touch electrode X-TE14 located at row 1, column 4 and the X-touch electrode X-TE24 located at row 2, column 4 are not connected to the X-touch line X-TL.

As described above, through the multi-feeding structure in which the touch lines TL are alternately arranged by two as a unit and the touch signals are simultaneously supplied to the X-touch electrodes X-TE located at the same row, the touch sensing performance may be improved by reducing the number of touch lines TL and securing the area of the touch electrode TE.

In the above, it has illustrated a multi-feeding structure in which the touch lines TL are alternately arranged by two as a unit and a touch signal is simultaneously supplied to the X-touch electrodes X-TE located at the same row as an example. However, it may be a multi-feeding structure in which the touch lines TL are alternately arranged in N as a unit (N is a natural number greater than or equal to 2) and a touch signal is simultaneously supplied to the X-touch electrodes X-TE located at the same row.

Meanwhile, the X-touch lines X-TL electrically connected to the X-touch electrode line X-TEL may be formed at a location spaced apart from the Y-touch electrode line Y-TEL by a predetermined or selected distance.

Figure 10:
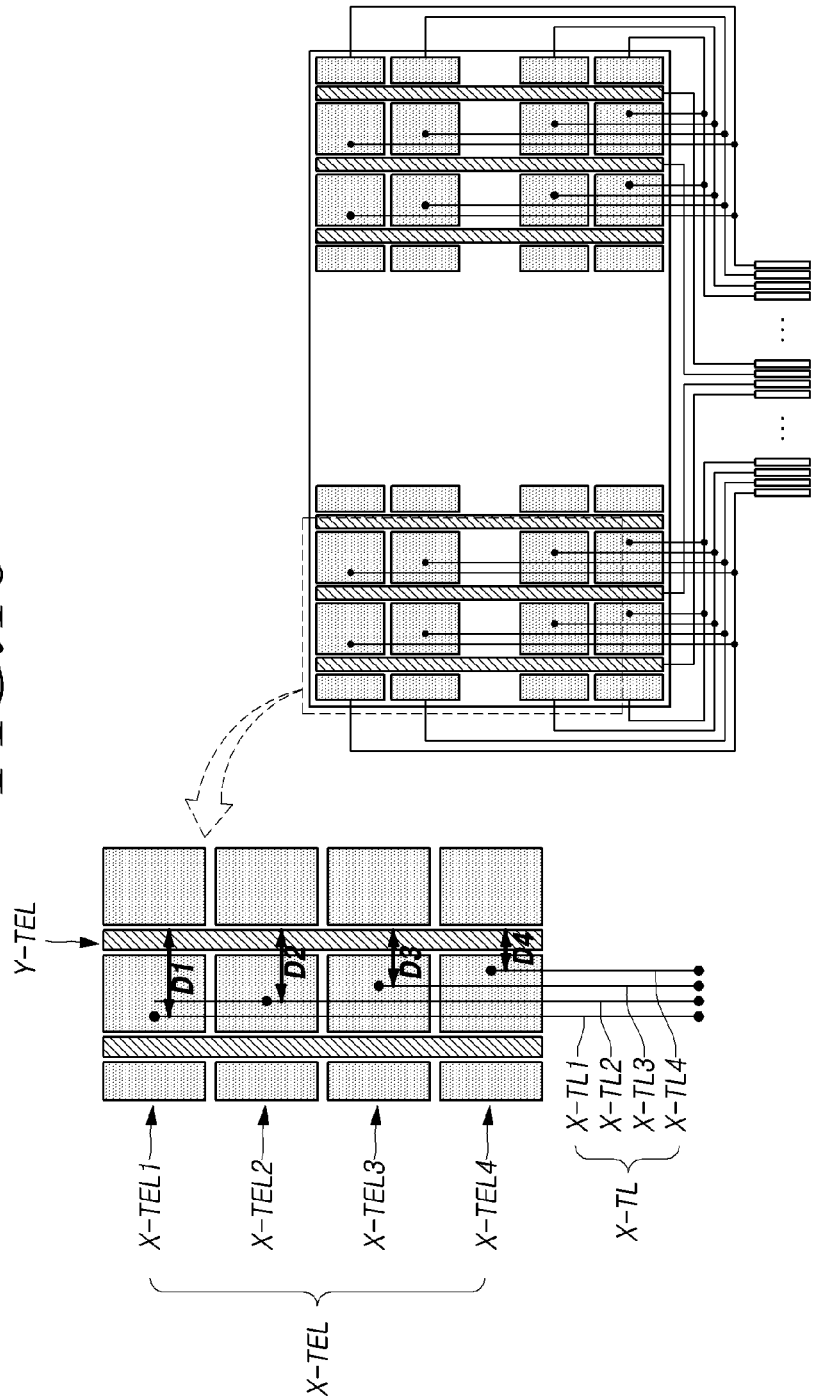
FIG. 10 illustrates an example of a distance between a touch line receiving a touch driving signal and a touch sensing electrode line transmitting a touch sensing signal in a touch display device.

FIG. 10 illustrates an example of a distance between a touch line receiving a touch driving signal and a touch sensing electrode line transmitting a touch sensing signal in a touch display device.

Here, it illustrates a structure that the X-touch electrode lines X-TEL1, X-TEL2, X-TEL3, X-TEL4 in the x-axis direction is composed of a plurality of X-touch electrodes X-TE corresponding to the touch driving electrodes, and the Y-touch electrode line Y-TEL in the y-axis direction is composed of one Y-touch electrode Y-TE corresponding to the touch sensing electrode.

At this time, a touch driving signal may be supplied to the first X-touch electrode line X-TEL1 located at row 1 through the first X-touch line X-TL1, and a touch driving signal may be supplied to the second X-touch electrode line X-TEL2 located at row 2 through the second X-touch line X-TL2.

In this structure, when the X-touch line X-TL is arranged in a straight line, the distances D1, D2, D3, D4 between the Y-touch electrode line Y-TEL corresponding to the touch sensing electrode and the X-touch line X-TL are different for each location of the X-touch electrode line X-TEL due to the location of the contact hole where the X-touch line X-TL and the X-touch electrode line X-TEL are connected.

In the case of FIG. 10, based on the Y-touch electrode line Y-TEL, the first distance D1 between the first X-touch line X-TL1 electrically connected to the first X-touch electrode line X-TEL1 and the Y-touch electrode line Y-TEL, the second distance D2 between the second X-touch line X-TL2 electrically connected to the second X-touch electrode line X-TEL2 and the Y-touch electrode line Y-TEL, the third distance D3 between the third X-touch line X-TL3 electrically connected to third X-touch electrode line X-TEL3 and the Y-touch electrode line Y-TEL, and the fourth distance D4 between the fourth X-touch line X-TL4 electrically connected to the fourth X-touch electrode line X-TEL4 and the Y-touch electrode line Y-TEL may be different.

For this reason, even if a touch occurs at the X-touch electrode X-TE at a specific location, it may cause parasitic capacitance due to another X-touch line X-TL passing through the corresponding X-touch electrode X-TE. Accordingly, touch performance may be degraded due to a deviation in parasitic capacitance from a difference in distance from the Y-touch electrode line Y-TEL.

This phenomenon may be especially increased in the case of multi-touch in which a plurality of fingers simultaneously touch a plurality of X-touch electrodes.

Figure 11:
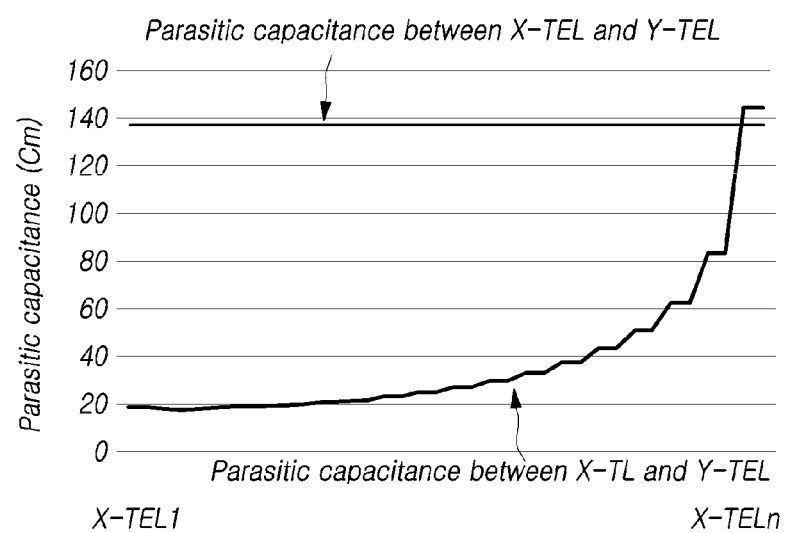
FIG. 11 illustrates an example of parasitic capacitance occurring in a Y-touch electrode line in a touch display device with a multi-feeding structure.

FIG. 11 illustrates an example of parasitic capacitance occurring in a Y-touch electrode line in a touch display device with a multi-feeding structure.

Referring to FIG. 11, the X-touch electrode line X-TEL corresponding to the touch driving electrode is uniformly arranged around the Y-touch electrode line Y-TEL corresponding to the touch sensing electrode in the touch display device 100 with a multi-feeding structure. Accordingly, the parasitic capacitance Cm formed between the X-touch electrode line X-TEL and the Y-touch electrode line Y-TEL may have a uniform distribution.

On the other hand, the distances D1, D2, D3, D4 between the Y-touch electrode line Y-TEL and the X-touch line X-TL are different for each location of the X-touch electrode line X-TEL due to the location of the contact hole where the X-touch line X-TL and the X-touch electrode line X-TEL are connected. Accordingly, the parasitic capacitance Cm formed between the X-touch line X-TL and the Y-touch electrode line Y-TEL may have a non-uniform distribution.

In particular, since a greater number of X-touch lines X-TL may be arranged at a location closer to the touch driving circuit 150, the parasitic capacitance Cm formed between the X-touch line X-TL and the Y-touch electrode line Y-TEL may increase as the location closer to the touch driving circuit 150.

For this reason, in the case that the touch line TL is formed in a multi-feeding structure in order to simultaneously supply a touch driving signal to a plurality of touch driving electrodes constituting the X-touch electrode line X-TEL, touch performance may be degraded and it may be difficult to determine an accurate touch position due to the parasitic capacitance Cm formed between the X-touch line X-TL and the Y-touch electrode line Y-TEL.

In order to solve the above problem, it may uniformly form the distances D1, D2, D3, D4 between the Y-touch electrode line Y-TEL corresponding to touch sensing electrodes and the X-touch line X-TL corresponding to the touch driving line to reduce the deviation of the parasitic capacitance Cm formed between the X-touch line X-TL and the Y-touch electrode line Y-TEL.

For the purpose of above, the X-touch line X-TL extending in the y-axis direction may be shifted in the direction of the Y-touch electrode line Y-TEL through a shifting area.

Figure 12:
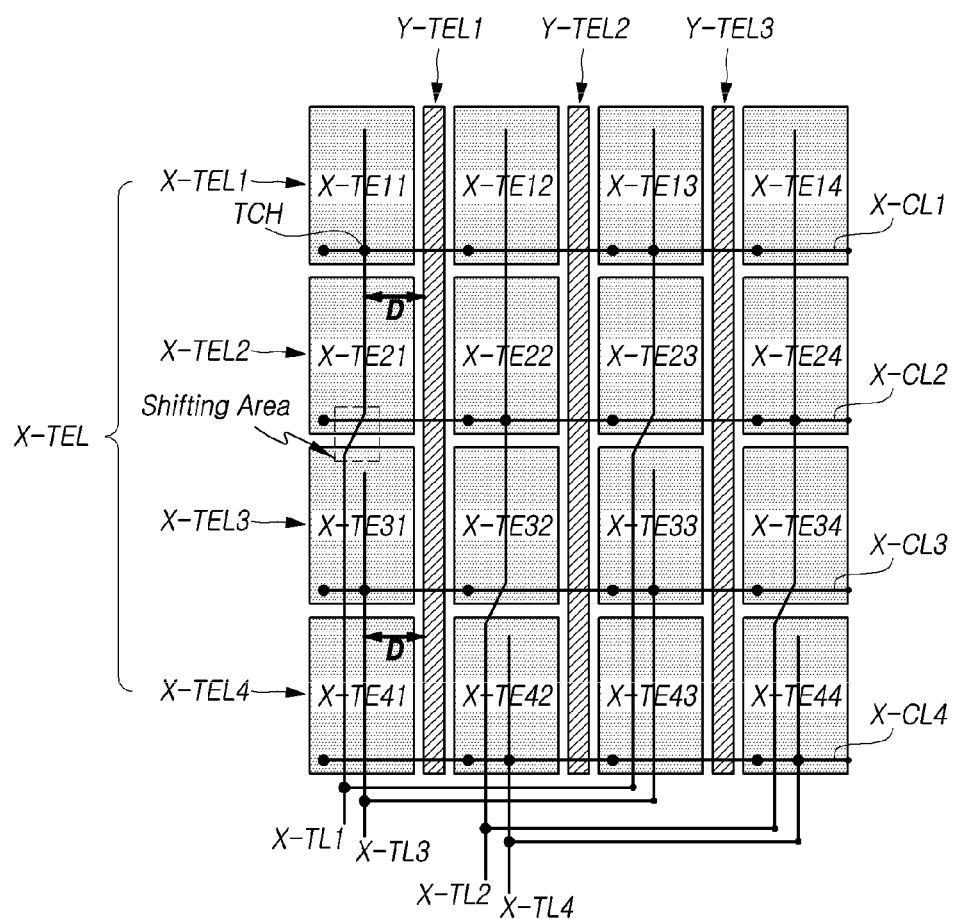
FIG. 12 illustrates a multi-feeding structure in which touch lines with a shifting area are alternately arranged in a touch display device according to an embodiment of the present disclosure.

FIG. 12 illustrates a multi-feeding structure in which touch lines with a shifting area are alternately arranged in a touch display device according to an embodiment of the present disclosure.

Referring to FIG. 12, the display panel 110 in the touch display device 100 according to an embodiment of the present disclosure may include an X-touch electrode line X-TEL composed of a plurality of X-touch electrodes arranged in the x-axis direction to simultaneously receive the touch driving signal, a Y-touch electrode line Y-TEL arranged in the y-axis direction to transmit a touch sensing signal, and a plurality of X-touch lines X-TL that are arranged in the y-axis direction and electrically connected to a designated X-touch electrode X-TE to transmit a touch driving signal through a touch contact hole TCH, wherein the plurality of X-touch lines X-TL may be arranged to have uniform distances D between the touch contact hole TCH electrically connected to the plurality of X-touch electrodes X-TE constituting a same X-touch electrode line and the adjacent Y-touch electrode line Y-TEL. The plurality of touch contact holes TCH may be disposed to be displaced from each other in both areas based on the plurality of Y-touch electrode lines.

For example, the third X-touch line X-TL3 among the plurality of X-touch lines X-TL closest to the first Y-touch electrode line Y-TEL1 may be electrically connected to the third X-touch electrode line X-TEL3 through the touch contact hole TCH at a point spaced apart from the first Y-touch electrode line Y-TEL1 by a predetermined or selected distance D. Accordingly, the distance between the third X-touch line X-TL3 connected to the third X-touch electrode line X-TEL3 and the first Y-touch electrode line Y-TEL1 may be D.

Since the third X-touch line X-TL3 is electrically connected to the third X-touch electrode line X-TEL3 through the touch contact hole TCH, the third X-touch electrode line X-TEL3 may be extended only to the shifting area.

On the other hand, the first X-touch line X-TL1 may be arranged to be shifted in the direction of the first Y-touch electrode line Y-TEL1 by a predetermined or selected distance or uniform interval in the shifting area.

At this time, the distance at which the first X-touch line X-TL1 is shifted in the shifting area may correspond to the interval between the first X-touch line X-TL1 and the third X-touch line X-TL3. As a result, the position at which the first X-touch line X-TL1 is shifted in the shifting area corresponds to a point where the distance from the first Y-touch electrode line Y-TEL1 is D. Additionally, the point where the first X-touch line X-TL1 is connected to the first X-touch electrode line X-TEL1 corresponds to a point where the distance from the first Y-touch electrode line Y-TEL1 is D same as the third X-touch line X-TL3.

Similarly, the first X-touch line X-TL1 may be extended only to the shifting area of the first X-touch electrode line X-TEL1 by being located only up to the touch contact hole TCH electrically connected to the first X-touch electrode line X-TEL1.

As described above, the point where each X-touch line X-TL is electrically connected to the X-touch electrode line X-TEL through the touch contact hole TCH may be arranged to have a uniform distance D from the Y-touch electrode line Y-TEL by sequentially shifting the X-touch line X-TL connected to the X-touch electrode line X-TEL in the shifting area.

At this time, the shifting area in which the X-touch line X-TL is arranged in a shifting structure may correspond to an edge area of the X-touch electrode line X-TEL in order for uniform arrangement with respect to the Y-touch electrode line Y-TEL. For example, when the touch driving circuit 150 is located at lower area of the display panel 110, the shifting area in which the X-touch line X-TL is arranged in a shifting structure may correspond to a lower edge area of the X-touch electrode line X-TEL since the X-touch line X-TL extends from the lower side to the upper side of the display panel 110.

Also, the X-touch electrode lines X-TEL located on both sides of the Y-touch electrode line Y-TEL may be connected through the X-touch electrode connection line X-CL. At this time, the point where the X-touch electrode connection line X-CL is connected may correspond to the touch contact hole TCH where the X-touch line X-TL is electrically connected to the X-touch electrode line X-TEL. In this case, the X-touch electrode connection line X-CL connecting the X-touch electrode lines X-TEL located on both sides of the Y-touch electrode line Y-TEL and the X-touch line X-TL electrically connected to the X-touch electrode line X-TEL may be connected by one touch contact hole TCH.

In addition, it is preferable to form the X-touch lines X-TL so as to form a symmetrical structure with the Y-touch electrode line Y-TEL based on the touch contact hole TCH connected by the X-touch electrode connection line X-CL for uniform arrangement of the Y-touch electrode line Y-TEL.

At this time, the distance D between the Y-touch electrode line Y-TEL corresponding to the touch sensing electrode and the X-touch line X-TL corresponding to the touch driving line is uniformly formed, but the direction in which the X-touch line X-TL is shifted in the shifting area may be a horizontal direction or a diagonal direction.

As described above, when the X-touch lines X-TL with the shifting area are alternately arranged, the number of touch lines TL may be reduced and the touch sensing performance may be improved by uniformly distributing the capacitance between the Y-touch electrode lines Y-TEL.

In addition, when the X-touch lines X-TL with the shifting area are alternately arranged, the connection point of the X-touch lines (e.g., X-TL1 and X-TL3) connected to the X-touch electrodes of the left area and the connection point of the X-touch lines (e.g., X-TL2, X-TL4) connected to the X-touch electrodes of the right area with respect to the Y-touch electrode line Y-TEL may be displaced from each other.

On the other hand, when the plurality of X-touch lines X-TL are arranged such that a uniform patterns are repeated based on a touch node where the plurality of X-touch electrode lines X-TEL and the plurality of Y-touch electrode lines Y-TEL overlap, the touch performance may be improved due to a uniform capacitance formed between the Y-touch electrode lines Y-TEL.

Here, it has illustrated a case in which two X-touch lines X-TL are arranged on the left and right sides of the Y-touch electrode line Y-TEL as an example as a case of a touch electrode structure of a 4×4 arrangement. However, when the number of touch electrodes increases, the number of X-touch lines X-TL arranged on the left and right sides of the Y-touch electrode line Y-TEL will also increase.

Figure 13:
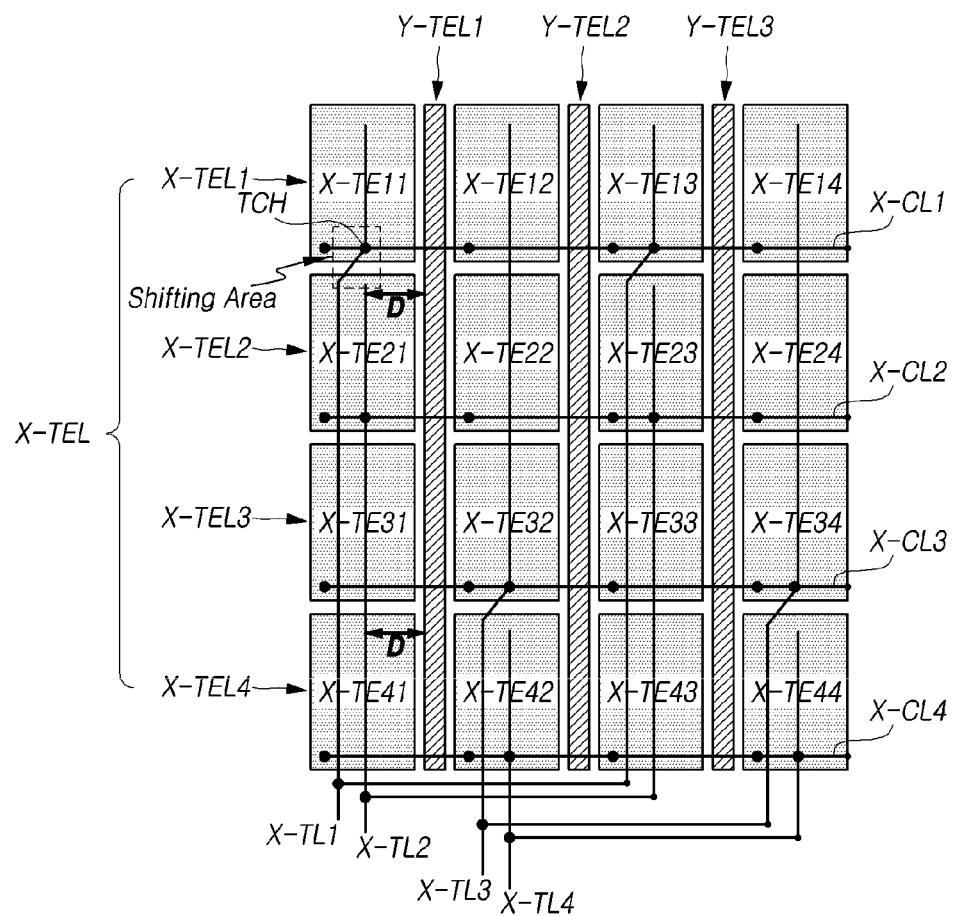
FIG. 13 illustrates a multi-feeding structure in which touch lines with a shifting area are alternately arranged by two as a unit in a touch display device according to an embodiment of the present disclosure.

FIG. 13 illustrates a multi-feeding structure in which touch lines with a shifting area are alternately arranged by two as a unit in a touch display device according to an embodiment of the present disclosure.

Referring to FIG. 13, the display panel 110 in the touch display device 100 according to an embodiment of the present disclosure may include an X-touch electrode line X-TEL composed of a plurality of X-touch electrodes arranged in the x-axis direction to simultaneously receive the touch driving signal, a Y-touch electrode line Y-TEL arranged in the y-axis direction to transmit a touch sensing signal, and a plurality of X-touch lines X-TL that are arranged in the y-axis direction and electrically connected to a designated X-touch electrode X-TE to transmit a touch driving signal through a touch contact hole TCH, wherein the plurality of X-touch lines X-TL may be arranged to have uniform distances D between the touch contact hole TCH connected to the X-touch electrode X-TE and the adjacent Y-touch electrode line Y-TEL.

For example, the second X-touch line X-TL2 among the plurality of X-touch lines X-TL closest to a left side of the first Y-touch electrode line Y-TEL1 may be electrically connected to the second X-touch electrode line X-TEL2 through the touch contact hole TCH at a point spaced apart from the first Y-touch electrode line Y-TEL1 by a predetermined or selected distance D. Accordingly, the distance between the second X-touch line X-TL2 connected to the second X-touch electrode line X-TEL2 and the first Y-touch electrode line Y-TEL1 may be D.

Since the second X-touch line X-TL2 is electrically connected to the second X-touch electrode line X-TEL2 through the touch contact hole TCH, the second X-touch electrode line X-TEL2 may be extended only to the shifting area.

On the other hand, the first X-touch line X-TL1 may be arranged to be shifted in the direction of the first Y-touch electrode line Y-TEL1 by a predetermined or selected distance from the shifting area.

At this time, the distance at which the first X-touch line X-TL1 is shifted in the shifting area may correspond to the interval between the first X-touch line X-TL1 and the second X-touch line X-TL2. As a result, the position at which the first X-touch line X-TL1 is shifted in the shifting area corresponds to a point where the distance from the first Y-touch electrode line Y-TEL1 is D. Additionally, the point where the first X-touch line X-TL1 is connected to the first X-touch electrode line X-TEL1 corresponds to a point where the distance from the first Y-touch electrode line Y-TEL1 is D same as the second X-touch line X-TL2.

Similarly, the first X-touch line X-TL1 may be extended only to the shifting area of the first X-touch electrode line X-TEL1 by being located only up to the touch contact hole TCH electrically connected to the first X-touch electrode line X-TEL1.

As described above, the point where each X-touch line X-TL is electrically connected to the X-touch electrode line X-TEL through the touch contact hole TCH may be arranged to have a uniform distance D from the Y-touch electrode line Y-TEL by sequentially shifting the X-touch line X-TL connected to the X-touch electrode line X-TEL in the shifting area.

At this time, the shifting area in which the X-touch line X-TL is arranged in a shifting structure may correspond to an edge area of the touch electrode line X-TEL in order for uniform arrangement with respect to the Y-touch electrode line Y-TEL. For example, when the touch driving circuit 150 is located at lower area of the display panel 110, the shifting area in which the X-touch line X-TL is arranged in a shifting structure may correspond to a lower edge area of the X-touch electrode line X-TEL since the X-touch line X-TL extends from the lower side to the upper side of the display panel 110.

Also, the X-touch electrode lines X-TEL located on both sides of the Y-touch electrode line Y-TEL may be connected through the X-touch electrode connection line X-CL. At this time, the point where the X-touch electrode connection line X-CL is connected may correspond to the touch contact hole TCH where the X-touch line X-TL is electrically connected to the X-touch electrode line X-TEL. In this case, the X-touch electrode connection line X-CL connecting the X-touch electrode lines X-TEL located on both sides of the Y-touch electrode line Y-TEL and the X-touch line X-TL electrically connected to the X-touch electrode line X-TEL may be connected by one touch contact hole TCH.

In addition, it is preferable to form the X-touch lines X-TL so as to form a symmetrical structure with the Y-touch electrode line Y-TEL based on the touch contact hole TCH connected by the X-touch electrode connection line X-CL for uniform arrangement of the Y-touch electrode line Y-TEL.

At this time, the distance D between the Y-touch electrode line Y-TEL corresponding to the touch sensing electrode and the X-touch line X-TL corresponding to the touch driving line is uniformly formed, but the direction in which the X-touch line X-TL is shifted in the shifting area may be a horizontal direction or a diagonal direction.

As described above, when the X-touch lines X-TL with the shifting area are alternately arranged, the number of touch lines TL may be reduced and the touch sensing performance may be improved by uniformly distributing the capacitance between the Y-touch electrode lines Y-TEL.

Here, it has illustrated a case in which two X-touch lines X-TL are arranged on the left and right sides of the Y-touch electrode line Y-TEL as an example as a case of a touch electrode structure of a 4×4 arrangement. However, when the number of touch electrodes increases, the number of X-touch lines X-TL arranged on the left and right sides of the Y-touch electrode line Y-TEL will also increase.

On the other hand, the touch electrode lines X-TEL, Y-TEL arranged in the touch display device 100 may be of a plate type touch electrode metal without an opening, or may be of a mesh-type touch electrode metal with openings for the emitting efficiency of the subpixel SP.

Figure 14:
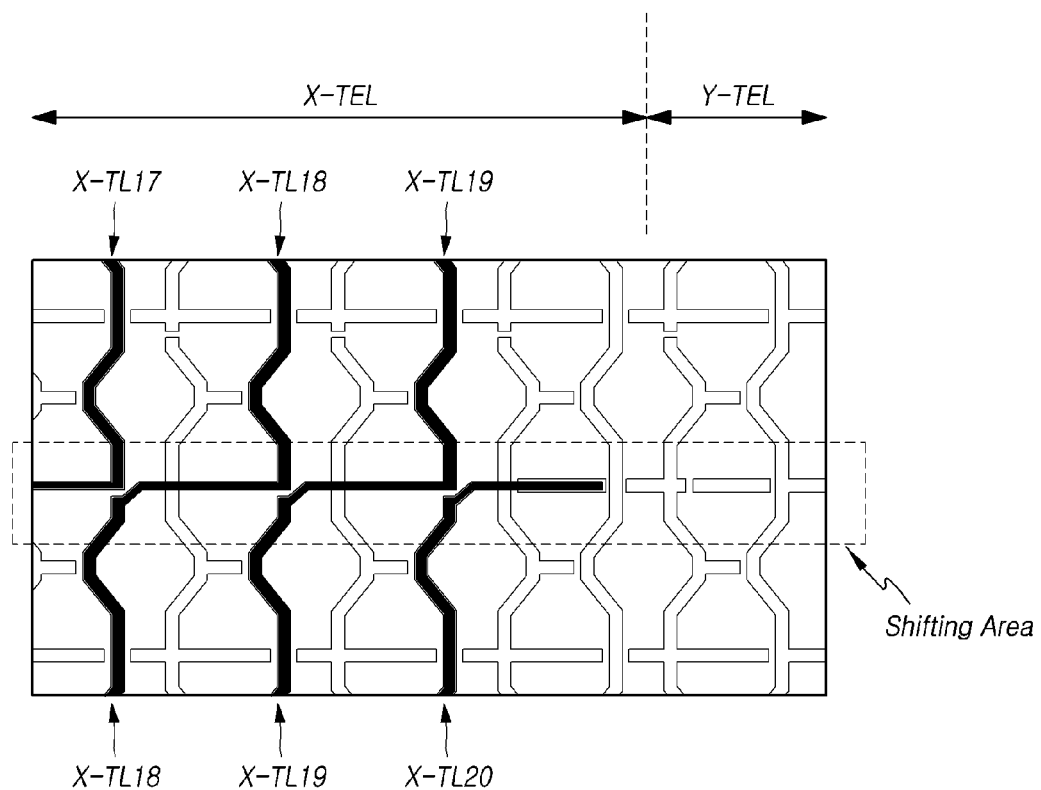
FIG. 14 illustrates a touch line of a shifting area when the touch electrode line is made of a mesh-type touch electrode metal in the touch display device according to an embodiment of the present disclosure.

FIG. 14 illustrates a touch line of a shifting area when the touch electrode line is made of a mesh-type touch electrode metal in the touch display device according to an embodiment of the present disclosure.

Referring to FIG. 14, the X-touch electrode line X-TEL receiving a touch driving signal and the Y-touch electrode line Y-TEL transmitting a touch sensing signal in the touch display device 100 according to an embodiment of the present disclosure may be formed of a mesh-type touch electrode metal with openings.

In this case, the touch electrode lines X-TEL, Y-TEL may extend in a structure in which openings are formed in the center and the touch electrode metal surrounding the openings is repeated. Here, it has illustrated a case in which the touch electrode metal surrounding the openings is formed in an octagonal shape as an example.

At this time, the X-touch line X-TL for supplying the touch driving signal extends along the octagonal touch electrode metal constituting the X-touch electrode line X-TEL, and certain X-touch line X-TL may be electrically connected to the corresponding X-touch electrode line X-TEL through the touch contact hole TCH at a position spaced apart from the Y-touch electrode line Y-TEL by a predetermined or selected distance D.

Here, it has illustrated a case in which 20 X-touch lines X-TL are arranged as an example.

On the other hand, the touch electrode lines X-TEL, Y-TEL may be made of a transparent electrode or may include a transparent electrode for the emitting efficiency of the subpixel SP.

Figure 15:
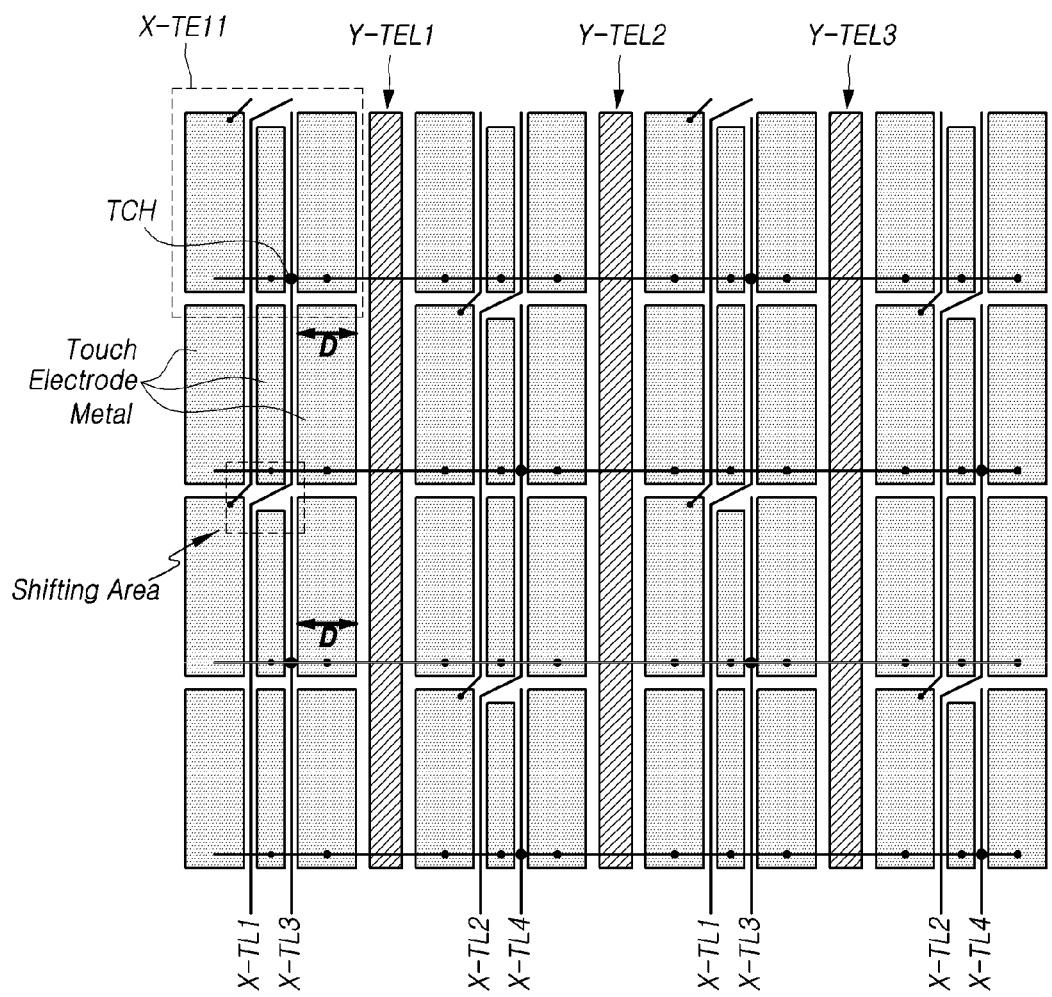
FIG. 15 illustrates FIG. 12 where the touch electrode line is made of a mesh-type touch electrode metal in the touch display device according to an embodiment of the present disclosure.

FIG. 15 illustrates FIG. 12 where the touch electrode line is made of a mesh-type touch electrode metal in the touch display device according to an embodiment of the present disclosure. Also, FIG. 16 illustrates FIG. 13 where the touch electrode line is made of a mesh-type touch electrode metal in the touch display device according to an embodiment of the present disclosure.

Figure 16:
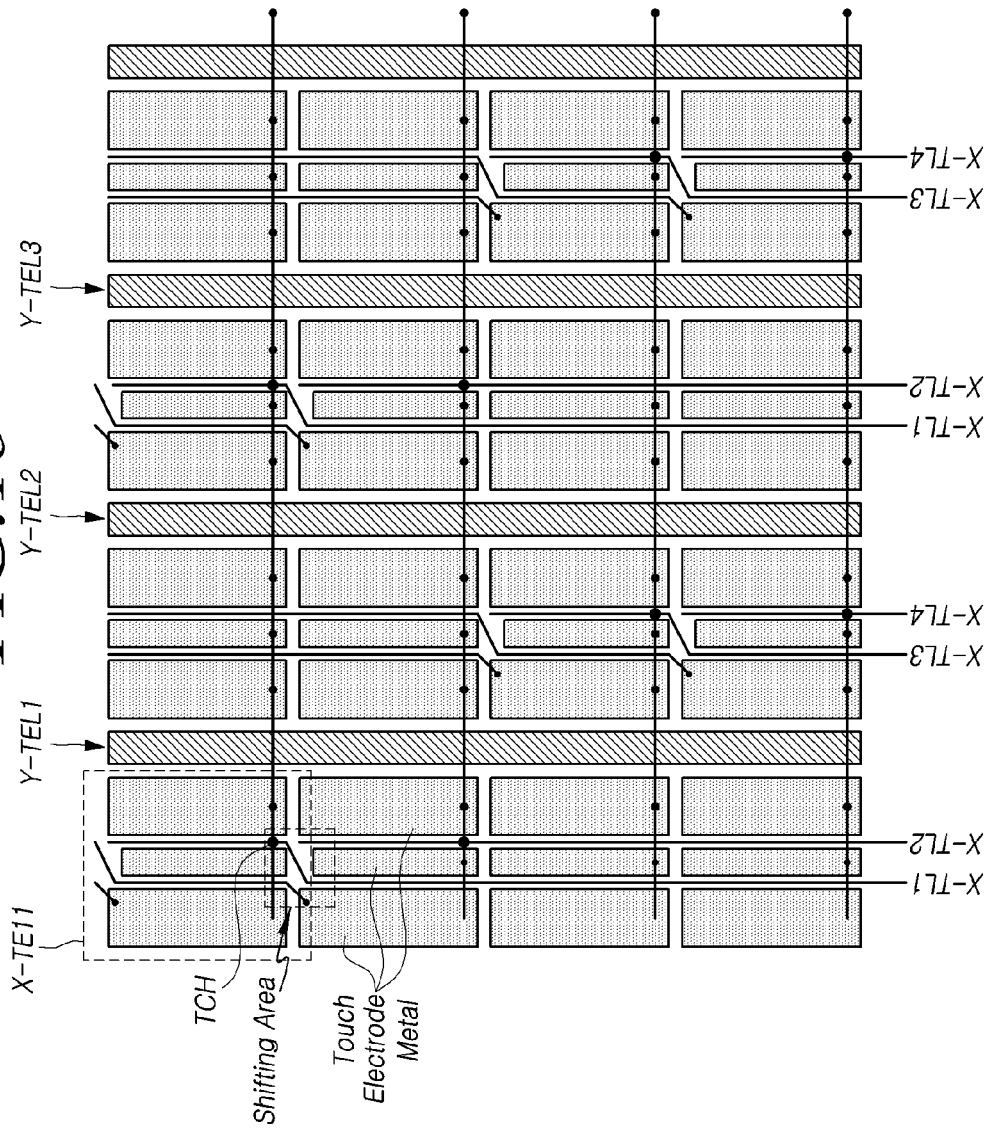
FIG. 16 illustrates FIG. 13 where the touch electrode line is made of a mesh-type touch electrode metal in the touch display device according to an embodiment of the present disclosure.

Referring to FIGS. 15 and 16, the touch electrode line TEL of the touch display device 100 according to an embodiment of the present disclosure may be made of a mesh-type touch electrode metals, and the X-touch line X-TL may be extended through an area between the mesh-type touch electrode metals.

In this case, the shifting area in which the X-touch lines X-TL are shifted may be formed in an area where the mesh-type touch electrode metals are not formed. Accordingly, the mesh-type touch electrode metals constituting the X-touch electrodes X-TE may be formed in an area that does not overlap to an area where the X-touch lines X-TL are extended.

However, since the X-touch lines X-TL connecting the mesh-type touch electrode metals may be formed by repeating a uniform pattern based on a touch node where a plurality of X-touch electrode lines X-TEL overlap a plurality of Y-touch electrode lines Y-TEL, a uniform capacitance may be formed.

For the purpose of above, when the X-touch line X-TL is shifted to the right in the shifting area, additional X-touch line X-TL for supplementing the X-touch line X-TL from the mesh-type touch electrode metal located at the left of the X-touch line X-TL may be additionally disposed.

Figure 17:
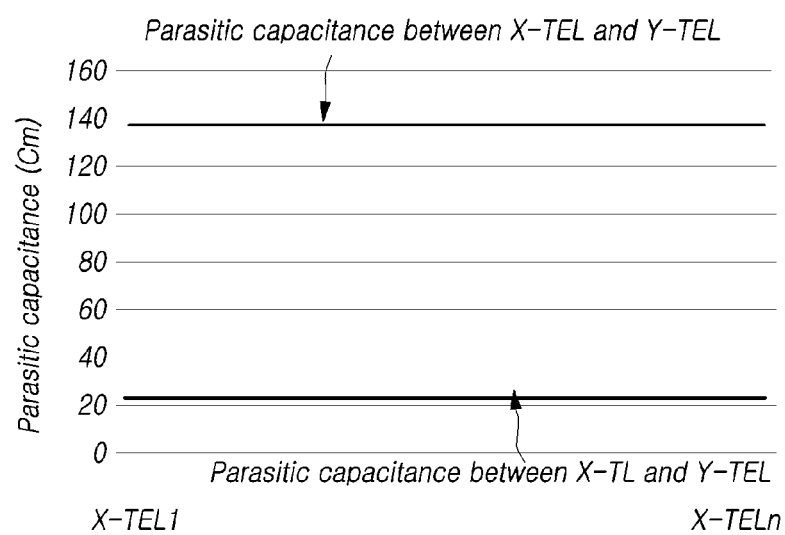
FIG. 17 illustrates an example of parasitic capacitance occurring in a Y-touch electrode line in a touch display device according to an embodiment of the present disclosure.

FIG. 17 illustrates an example of parasitic capacitance occurring in a Y-touch electrode line in a touch display device according to an embodiment of the present disclosure.

Referring to FIG. 17, the touch display device 100 according to an embodiment of the present disclosure may have a uniform parasitic capacitance Cm formed between the X-touch electrode line X-TEL and the Y-touch electrode line Y-TEL since the X-touch electrode line X-TEL corresponding to the touch driving electrode are uniformly arranged around the Y-touch electrode line Y-TEL corresponding to the touch sensing electrode.

In addition, a point where each X-touch line X-TL is electrically connected to the X-touch electrode line X-TEL through the touch contact hole TCH may be arranged to have a uniform distance from the Y-touch electrode line Y-TEL by shifting the X-touch line X-TL connected to the X-touch electrode line X-TEL in the shifting area. Accordingly, the parasitic capacitance Cm formed between the X-touch line X-TL and the Y-touch electrode line Y-TEL may also be formed with a uniform distribution.

As a result, the touch display device 100 according to an embodiment of the present disclosure may reduce the number of touch lines TL and secure the area of the touch electrodes TE by alternately arranging the X-touch lines X-TL connected to the X-touch electrodes X-TE, and may improve the touch sensing performance through the multi-feeding structure to simultaneously supply the touch signal to the X-touch electrodes X-TE located at the same row.

At the same time, it may have excellent touch performance due to a uniform capacitance formed between the X-touch line X-TL and the Y-touch electrode line Y-TEL by arranging in a uniform distance between the touch contact hole TCH in which the X-touch line X-TL is connected to the X-touch electrode line X-TEL and the Y-touch electrode line Y-TEL through the shifting area.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display device comprising:
a display panel in which:
a plurality of X-touch electrodes arranged in a first direction are electrically connected to form an X-touch electrode line and a plurality of X-touch electrode lines are arranged in parallel to receive a plurality of touch driving signals, and
a plurality of Y-touch electrode lines are extended in a second direction to transmit a plurality of touch sensing signals; and
a touch driving circuit for supplying the plurality of touch driving signals to the plurality of X-touch electrode lines and for sensing a touch by detecting the plurality of touch sensing signals from the plurality of Y-touch electrode lines,
wherein a plurality of X-touch lines transmitting the plurality of touch driving signals to the plurality of X-touch electrode lines are extended in the second direction and are alternately connected to respective pluralities of X-touch electrodes of the plurality of X-touch electrode lines through a plurality of touch contact holes to electrically connect each plurality of X-touch electrodes constituting a same X-touch electrode line;
wherein at least two of the plurality of X-touch lines are shifted at uniform intervals in a shifting area.

2. The touch display device according to claim 1, wherein the plurality of X-touch lines are alternately connected by N as a unit, N being a natural number greater than or equal to 2.

3. The touch display device according to claim 1, wherein the plurality of touch contact holes are disposed to be displaced from each other in at least two areas based on the plurality of Y-touch electrode lines.

4. The touch display device according to claim 1, wherein the plurality of touch contact holes through which the plurality of X-touch lines are electrically connected to designated X-touch electrodes are arranged having distances to adjacent Y-touch electrode lines that are uniform.

5. The touch display device according to claim 1, wherein a distance at which the plurality of X-touch electrode lines is shifted corresponds to an interval between adjacent X-touch lines.

6. The touch display device according to claim 1, wherein a direction in which the plurality of X-touch lines is shifted in the shifting area is a diagonal direction of an adjacent Y-touch electrode line.

7. The touch display device according to claim 1, wherein the shifting area is formed in an area where mesh-type touch electrode metals constituting the X-touch electrode are not formed.

8. The touch display device according to claim 1, wherein the plurality of X-touch lines is arranged such that a selected pattern is repeated based on a touch node where the plurality of X-touch electrode lines and the plurality of Y-touch electrode lines overlap.

9. The touch display device according to claim 1, wherein the plurality of touch contact holes through which the plurality of X-touch lines are electrically connected to designated X-touch electrodes are electrically connected to X-touch electrode connection lines located on both sides of the Y-touch electrode line.

10. The touch display device according to claim 1, wherein a first area in which the plurality of X-touch electrode lines are formed has a ratio in a range of 5:1 to 2:1 with a second area in which the plurality of Y-touch electrode lines are formed.

11. The touch display device according to claim 1, wherein the plurality of X-touch electrodes are electrically connected to a different X-touch electrode that is adjacent in the first direction through an X-touch electrode connection line, wherein the X-touch electrode connection line is arranged on the same plane with the X-touch electrodes and electrically connected to two X-touch electrodes that are adjacent in the first direction without a separate contact hole, or is integrated with two X-touch electrodes that are adjacent in the first direction.

12. The touch display device according to claim 1, wherein at least one Y-touch line connected to the plurality of Y-touch electrode lines are arranged in a bezel area of the display panel, wherein a Y-touch bridge electrode with an integral structure is arranged under the Y-touch line, and wherein the Y-touch bridge electrode is connected to a ground voltage.

13. The touch display device according to claim 12, further comprising a Y-touch bridge line that is arranged to connect to a contact hole under the Y-touch line in a notch area and a bending area of the display panel, wherein the Y-touch line and the Y-touch bridge line are electrically connected to at least one contact hole formed at uniform distance.

14. The touch display device according to claim 1, wherein the shifting area corresponds to an edge area of the X-touch electrode lines.

15. A display panel comprising:
a plurality of X-touch electrode lines arranged in parallel to receive a plurality of touch driving signals, each of the plurality of X-touch electrode lines having a plurality of X-touch electrodes arranged in a first direction and electrically connected to each other;
a plurality of Y-touch electrode lines extended in a second direction to transmit a plurality of touch sensing signals; and
a plurality of X-touch lines extended in the second direction and alternately connected to the plurality of X-touch electrodes through a plurality of touch contact holes to electrically connect a plurality of X-touch electrodes constituting a same X-touch electrode line to each other,
wherein the plurality of touch contact holes through which the plurality of X-touch lines are electrically connected to designated X-touch electrode are arranged having a uniform distance to adjacent Y-touch electrode lines.

16. The display panel according to claim 15, wherein the plurality of X-touch lines are alternately connected by N as a unit, N being a natural number greater than or equal to 2.

17. The display panel according to claim 15, wherein the plurality of touch contact holes are disposed to be displaced from each other in at least two areas based on the plurality of Y-touch electrode lines.

18. The display panel according to claim 15, wherein the plurality of X-touch lines are shifted at a uniform interval in a shifting area.

19. The display panel according to claim 18, wherein the distance at which the plurality of X-touch electrode lines are shifted corresponds to an interval between adjacent X-touch lines.

20. The display panel according to claim 18, wherein the shifting area is formed in an area where mesh-type touch electrode metals constituting the X-touch electrode are not formed.

21. The display panel according to claim 18, wherein the plurality of X-touch lines are arranged such that a selected pattern is repeated based on a touch node where the plurality of X-touch electrode lines and the plurality of Y-touch electrode lines overlap.

22. The display panel according to claim 15, wherein the plurality of touch contact holes through which the plurality of X-touch lines are electrically connected to designated X-touch electrodes are electrically connected to X-touch electrode connection lines located on both sides of the Y-touch electrode line.

23. The display panel according to claim 15, wherein each of the plurality of X-touch electrodes is electrically connected to a different X-touch electrode that is adjacent in the first direction through an X-touch electrode connection line, wherein the X-touch electrode connection line is arranged on the same plane with the X-touch electrodes and electrically connected to two X-touch electrodes that are adjacent in the first direction without a separate contact hole, or is integrated with two X-touch electrodes that are adjacent in the first direction.

24. The display panel according to claim 15, wherein at least one Y-touch line connected to the plurality of Y-touch electrode lines is arranged in a bezel area of the display panel, wherein a Y-touch bridge electrode with an integral structure is arranged under the Y-touch line, and wherein the Y-touch bridge electrode is connected to a ground voltage.

25. The display panel according to claim 24, further comprising a Y-touch bridge line that is arranged to connect to a contact hole under the Y-touch line in a notch area and a bending area of the display panel, wherein the Y-touch line and the Y-touch bridge line are electrically connected to at least one contact hole formed at a uniform distance.

26. The display panel according to claim 18, wherein the shifting area corresponds to an edge area of the X-touch electrode lines.

27. A touch display device, comprising:
a display panel including:
an X-touch electrode line including a plurality of X-touch electrodes arranged in a first direction that are electrically connected to each other; and
a Y-touch electrode line that extends in a second direction;
a plurality of touch contact holes, each of the plurality of touch contact holes being positioned over a respective one of the plurality of X-touch electrodes; and
an X-touch line extended in the second direction and being connected to half or fewer of the plurality of X-touch electrodes via the plurality of touch contact holes;
a touch driving circuit for supplying touch driving signals to the plurality of X-touch electrode lines and for sensing a touch by detecting touch sensing signals from the plurality of Y-touch electrode lines.

28. The touch display device of claim 27, further comprising:
a second X-touch electrode line arranged parallel to the X-touch electrode line along the second direction; and
a shifting area between the X-touch electrode line and the second X-touch electrode line;
wherein the X-touch line extends diagonally to the first direction in the shifting area.

* * * * *